United States Patent
Oda et al.

(10) Patent No.: US 12,413,222 B2
(45) Date of Patent: Sep. 9, 2025

(54) DETECTION CIRCUIT AND POWER SUPPLY CONTROL DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Kota Oda, Yokkaichi (JP); Masaya Ina, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 113 days.

(21) Appl. No.: 18/247,149

(22) PCT Filed: Jul. 21, 2021

(86) PCT No.: PCT/JP2021/027304
§ 371 (c)(1),
(2) Date: Mar. 29, 2023

(87) PCT Pub. No.: WO2022/070569
PCT Pub. Date: Apr. 7, 2022

(65) Prior Publication Data
US 2024/0250679 A1    Jul. 25, 2024

(30) Foreign Application Priority Data

Oct. 1, 2020    (JP) ................................ 2020-167159

(51) Int. Cl.
*H03K 17/082*    (2006.01)
*G01R 19/165*    (2006.01)

(52) U.S. Cl.
CPC ..... *H03K 17/082* (2013.01); *G01R 19/16576* (2013.01)

(58) Field of Classification Search
CPC ............ H03K 17/082; G01R 19/16576; G01R 19/16538
See application file for complete search history.

(56) References Cited

U.S. PATENT DOCUMENTS

2017/0373676 A1\* 12/2017 Kaeriyama ........ H03K 17/0406
2019/0181850 A1    6/2019 Sawano et al.
(Continued)

FOREIGN PATENT DOCUMENTS

JP    2001-237676 A    8/2001
JP    2016-192838 A    11/2016

OTHER PUBLICATIONS

International Search Report, Application No. PCT/JP2021/027304, mailed Sep. 7, 2021. ISA/Japan Patent Office.

*Primary Examiner* — Sisay G Tiku
(74) *Attorney, Agent, or Firm* — Honigman LLP

(57) ABSTRACT

In a second detection circuit, a current output device outputs, to a circuit resistor, a current corresponding to a circuit voltage between an input terminal of a second FET to which a current is input and ground of a second drive circuit that switches the second FET ON or OFF. The second detection circuit outputs a voltage between two ends of the circuit resistor. A voltage between the ground of the second drive circuit and a downstream end of the circuit resistor is higher than 0 V.

12 Claims, 14 Drawing Sheets

(56) References Cited

U.S. PATENT DOCUMENTS

2019/0204889 A1* 7/2019 Kaeriyama ............. H02M 1/32
2019/0258284 A1    8/2019 Sawano et al.
2023/0402835 A1* 12/2023 Oda ........................ H02H 5/04

* cited by examiner

LEGEND
A= Microcomputer

LEGEND
A= Microcomputer

LEGEND
A= Microcomputer

LEGEND
A= Microcomputer

LEGEND
A= Microcomputer

LEGEND
A= Microcomputer

DETECTION CIRCUIT AND POWER SUPPLY CONTROL DEVICE

CROSS-REFERENCE TO RELATED APPLICATIONS

This application is the U.S. national stage of PCT/JP2021/027304 filed on Jul. 21, 2021, which claims priority of Japanese Patent Application No. JP 2020-167159 filed on Oct. 1, 2020, the contents of which are incorporated herein.

TECHNICAL FIELD

The present disclosure relates to a detection circuit and a power supply control device.

BACKGROUND

JP 2019-106624A discloses a power supply system for a vehicle, which supplies power from a DC power source to a load. In this power supply system, a semiconductor switch is disposed on a current path of a current that flows from the positive electrode of the DC power source to an end of the load. The semiconductor switch is an N-channel FET (Field Effect Transistor). The positive electrode of the DC power source is connected to an input terminal of the semiconductor switch, namely the drain to which the current is input. A switching circuit steps up a voltage of the input terminal of the semiconductor switch and applies the stepped-up voltage to a control terminal of the semiconductor switch, namely the gate. As a result, the semiconductor switch is switched ON.

In a conventional power supply system such as that described in JP 2019-106624A, the switching circuit steps up a voltage between the ground of the switching circuit and the input terminal of the semiconductor switch. The negative electrode of the DC power source is connected to a ground conductor, such as a vehicle body, to be grounded. The switching circuit is connected to the ground conductor via a connecting wire. While power is supplied to the switching circuit, a current flows successively through the switching circuit, the connecting wire, and the ground conductor. The ground potential of the switching circuit is the potential of an upstream end of the connecting wire.

Let us assume that the resistance value of the connecting wire is not negligible. In this case, the voltage between the ground of the switching circuit and the input terminal of the semiconductor switch is lower than a voltage between the two terminals of the DC power source. The higher a voltage between two ends of the connecting wire is, the lower the voltage between the ground of the switching circuit and the input terminal of the semiconductor switch is. If the switching circuit steps up the voltage between the ground of the switching circuit and the input terminal of the semiconductor switch in a state where the voltage is lower than a certain value, an appropriate voltage may not be applied from the switching circuit to the semiconductor switch. In this case, a resistance value between the input terminal and an output terminal of the semiconductor switch, from which a current is output, may not decrease to a sufficiently small resistance value.

If a current flows via the semiconductor switch in the state where the resistance value between the input terminal and the output terminal of the semiconductor switch is not sufficiently small, the semiconductor switch generates a large amount of heat. Therefore, the temperature of the semiconductor switch may rise to an abnormal temperature and the semiconductor switch may break down. In order to prevent breakdown of the semiconductor switch, the switching circuit is not instructed to switch the semiconductor switch ON if the voltage between the ground of the switching circuit and the input terminal of the semiconductor switch is lower than the certain value. In order to realize this configuration, it is necessary to detect not the voltage between the two terminals of the DC power source but the voltage between the ground of the switching circuit and the input terminal of the semiconductor switch.

SUMMARY

Therefore, the present disclosure has an object of providing a detection circuit that detects a voltage between an input terminal of a semiconductor switch, to which a current is input, and the ground of a switching circuit that switches the semiconductor switch ON or OFF, and a power supply control device including the detection circuit.

A detection circuit according to an aspect of the present disclosure includes: a current output device configured to output a current corresponding to a circuit voltage between an input terminal of a semiconductor switch to which a current is input and ground of a switching circuit configured to switch the semiconductor switch ON or OFF; and a circuit resistor through which the current output from the current output device flows, wherein a voltage between two ends of the circuit resistor is output, and a voltage between the ground of the switching circuit and a downstream end of the circuit resistor is higher than 0 V.

A power supply control device according to an aspect of the present disclosure is configured to control power that is supplied via a semiconductor switch, the power supply control device including: a switching circuit configured to switch the semiconductor switch ON or OFF; a detection circuit configured to detect a circuit voltage between an input terminal of the semiconductor switch to which a current is input and ground of the switching circuit, and output a voltage indicating the detected circuit voltage; and a processor configured to execute processing, wherein the processor instructs the switching circuit to switch the semiconductor switch ON or OFF in accordance with the voltage that is output from the detection circuit, the detection circuit includes: a current output device configured to output a current corresponding to the circuit voltage; and a circuit resistor through which the current output from the current output device flows, the detection circuit outputs a voltage between two ends of the circuit resistor, and a voltage between the ground of the switching circuit and a downstream end of the circuit resistor is higher than 0 V.

Note that the present disclosure can be implemented not only as the power supply control device including the characteristic processor described above, but also as a power supply control method including a step of performing the characteristic processing described above, or a computer program for causing a computer to execute the step. Alternatively, the present disclosure can also be implemented as a semiconductor integrated circuit that implements some or all functions of the power supply control device, or a power supply system including the power supply control device.

Effects of Present Disclosure

According to the present disclosure, it is possible to detect a voltage between an input terminal of a semiconductor switch, to which a current is input, and the ground of a switching circuit that switches the semiconductor switch ON or OFF.

DETAILED DESCRIPTION OF PREFERRED EMBODIMENTS

Figure 1:
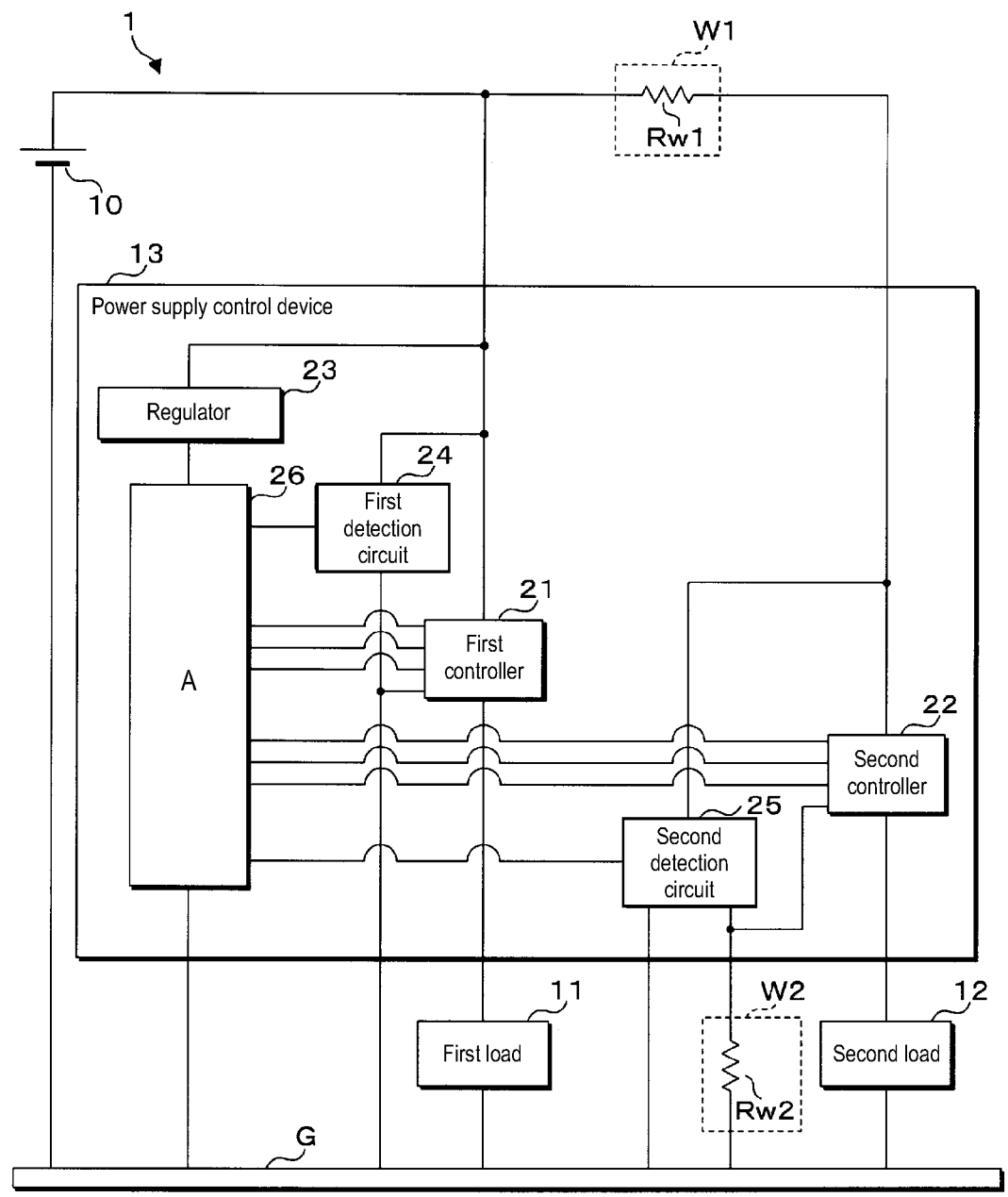
FIG. 1 is a block diagram showing the configuration of the main part of a power supply system according to a first embodiment.

First, embodiments of the present disclosure will be described. At least some portions of the following embodiments may also be combined.

First Aspect

In accordance with a first aspect, a detection circuit according to an aspect of the present disclosure includes: a current output device configured to output a current corresponding to a circuit voltage between an input terminal of a semiconductor switch to which a current is input and ground of a switching circuit configured to switch the semiconductor switch ON or OFF; and a circuit resistor through which the current output from the current output device flows, wherein a voltage between two ends of the circuit resistor is output, and a voltage between the ground of the switching circuit and a downstream end of the circuit resistor is higher than 0 V.

According to this aspect, a current corresponding to the circuit voltage is output in order to detect the circuit voltage. In a case where the resistance value of the circuit resistor is constant, the voltage between the two ends of the circuit resistor is proportional to a current output to the circuit resistor. The current corresponding to the circuit voltage flows via the circuit resistor. Therefore, the circuit voltage can be calculated based on the voltage between the two ends of the circuit resistor. Moreover, the circuit voltage is converted to the current corresponding to the circuit voltage, and therefore, the circuit voltage can be calculated by a microcomputer whose ground differs from the ground of the switching circuit.

Second Aspect

In a second aspect, in the detection circuit according to an aspect of the present disclosure, the current output device includes: a device resistor to which a current flows from the input terminal of the semiconductor switch; and a PNP bipolar transistor including an emitter connected to a downstream end of the device resistor, wherein a potential of a base of the bipolar transistor is a ground potential of the switching circuit, and a current output from a collector of the bipolar transistor flows to the circuit resistor.

According to this aspect, the bipolar transistor adjusts a resistance value between the emitter and the collector in such a manner that a current proportional to the circuit voltage flows through the device resistor. Consequently, the circuit voltage is converted to the current proportional to the circuit voltage.

Third Aspect

In a third aspect, the detection circuit according to an aspect of the present disclosure includes a connection switch connected between the input terminal of the semiconductor switch and the current output device, wherein the current output device outputs a current drawn from the input terminal of the semiconductor switch to the circuit resistor.

According to this aspect, the detection circuit operates when the connection switch is switched ON. The detection circuit stops operation when the connection switch is switched OFF. The detection circuit is caused to operate only when it is necessary to detect the circuit voltage. Therefore, unnecessary power consumption is suppressed.

Fourth Aspect

In a fourth aspect, a power supply control device according to an aspect of the present disclosure is configured to control power that is supplied via a semiconductor switch, the power supply control device including: a switching circuit configured to switch the semiconductor switch ON or OFF; a detection circuit configured to detect a circuit voltage between an input terminal of the semiconductor switch to which a current is input and ground of the switching circuit, and output a voltage indicating the detected circuit voltage; and a processor configured to execute processing, wherein the processor instructs the switching circuit to switch the semiconductor switch ON or OFF in accordance with the voltage that is output from the detection circuit, the detection circuit includes: a current output device configured to output a current corresponding to the circuit voltage; and a circuit resistor through which the current output from the current output device flows, the detection circuit outputs a voltage between two ends of the circuit resistor, and a voltage between the ground of the switching circuit and a downstream end of the circuit resistor is higher than 0 V.

According to this aspect, the semiconductor switch is appropriately switched ON or OFF in accordance with the circuit voltage that is output from the detection circuit.

Fifth Aspect

In a fifth aspect, the power supply control device according to an aspect of the present disclosure further includes a current output unit configured to output a current corresponding to a current flowing through the semiconductor switch, and the voltage between the ground of the switching circuit and the downstream end of the circuit resistor fluctuates in accordance with the current output from the current output unit.

According to this aspect, the circuit voltage fluctuates in accordance with the current output from the current output unit.

Sixth Aspect

In a sixth aspect, in the power supply control device according to an aspect of the present disclosure, the switching circuit steps up the circuit voltage, and applies the stepped-up voltage to a control terminal of the semiconductor switch to switch the semiconductor switch ON.

According to this aspect, the semiconductor switch is an N-channel FET, for example. In this case, the input terminal and the control terminal of the semiconductor switch are the drain and the gate, respectively, for example. The switching circuit steps up the circuit voltage and applies the stepped-up voltage to the control terminal. As a result, the semiconductor switch is switched ON.

Seventh Aspect

In a seventh aspect, in the power supply control device according to an aspect of the present disclosure, the processor determines whether or not the circuit voltage is an ON voltage based on a voltage that is output from the detection circuit while the semiconductor switch is OFF, the ON voltage being a voltage that can be stepped up to a voltage with which the semiconductor switch can be switched ON, if it is determined that the circuit voltage is the ON voltage, the processor instructs the switching circuit to switch the semiconductor switch ON, and after giving the instruction to switch the semiconductor switch ON, the processor determines whether or not the semiconductor switch is ON.

According to this aspect, whether or not the semiconductor switch can be switched ON is checked when the circuit voltage is the ON voltage.

Eighth Aspect

In an eighth aspect, in the power supply control device according to an aspect of the present disclosure, power is supplied to the switching circuit with a current that flows from the input terminal of the semiconductor switch successively through the switching circuit and the ground of the switching circuit, the processor determines whether or not the circuit voltage is lower than a threshold voltage based on a voltage that is output from the detection circuit while the semiconductor switch is OFF, and if it is determined that the circuit voltage is lower than the threshold voltage, the processor determines whether or not the switching circuit is operating.

According to this aspect, the switching circuit stops operation when a voltage applied to the switching circuit is lower than a certain voltage. The threshold voltage is this voltage, for example. If the switching circuit is operating although a voltage between two ends of the switching circuit is lower than the threshold voltage, this means that a fault has occurred in the detection circuit. It is possible to detect a fault in the detection circuit by determining whether or not the switching circuit is operating.

The following describes specific examples of power supply systems according to embodiments of the present disclosure with reference to the drawings. Note that the present disclosure is not limited to the following examples, but is defined by the claims, and is intended to encompass all modifications within the meanings and scope that are equivalent to the claims.

First Embodiment

Configuration of Power Supply System

FIG. 1 is a block diagram showing the configuration of the main part of a power supply system 1 according to a first embodiment. The power supply system 1 is mounted on a vehicle and includes a DC power source 10, a first load 11, a second load 12, and a power supply control device 13. The DC power source 10 is a battery, for example. A first lead wire W1 and a second lead wire W2 whose resistance values are not negligible are used for connections in the power supply system 1. The equivalent circuits of the first lead wire W1 and the second lead wire W2 are represented by a first lead wire resistor Rw1 and a second lead wire resistor Rw2, respectively. The first lead wire W1 and the second lead wire W2 are long lead wires, for example. If the first lead wire W1 is long, the resistance value of the first lead wire resistor Rw1 is not negligible. If the second lead wire W2 is long, the resistance value of the second lead wire resistor Rw2 is not negligible.

The negative electrode of the DC power source 10 is connected to a ground conductor G. The negative electrode is grounded by being connected to the ground conductor G. The ground conductor G is a vehicle body, for example. The positive electrode of the DC power source 10 is connected to the power supply control device 13 and an end of the first lead wire resistor Rw1. The other end of the first lead wire resistor Rw1 is connected to the power supply control device 13. Furthermore, an end of the first load 11, an end of the second load 12, and an end of the second lead wire resistor Rw2 are individually connected to the power supply control device 13. The power supply control device 13, the other end of the first load 11, the other end of the second load 12, and the other end of the second lead wire resistor Rw2 are connected to the ground conductor G.

The DC power source 10 supplies power to the power supply control device 13. At this time, a current flows from the positive electrode of the DC power source 10 successively through the power supply control device 13 and the ground conductor G. The DC power source 10 supplies power to the first load 11 as well. At this time, a current flows from the positive electrode of the DC power source 10 successively through the power supply control device 13, the first load 11, and the ground conductor G. The DC power source 10 supplies power to the second load 12 as well. At this time, a current flows from the positive electrode of the DC power source 10 successively through the first lead wire resistor Rw1, the power supply control device 13, the second load 12, and the ground conductor G.

The power supply control device 13 controls power supply from the DC power source 10 to the first load 11 and power supply from the DC power source 10 to the second load 12. The first load 11 and the second load 12 are electric devices mounted on the vehicle. Each of the first load 11 and the second load 12 operates when power is supplied thereto. Each of the first load 11 and the second load 12 stops operation when power supply is stopped.

Configuration of Power Supply Control Device 13

The power supply control device 13 includes a first controller 21, a second controller 22, a regulator 23, a first detection circuit 24, a second detection circuit 25, and a microcomputer 26. The first controller 21, the regulator 23, and the first detection circuit 24 included in the power supply control device 13 are connected to the positive electrode of the DC power source 10. The first controller 21 is further connected to the upstream end of the first load 11 and the microcomputer 26. Each of the regulator 23 and the first detection circuit 24 is further connected to the microcomputer 26. The first controller 21, the first detection circuit 24, and the microcomputer 26 are connected to the ground conductor G.

Each of the second controller 22 and the second detection circuit 25 is connected to the downstream end of the first lead wire resistor Rw1, the microcomputer 26, and an end of the second lead wire resistor Rw2. The second controller 22 is further connected to the upstream end of the second load 12. The second detection circuit 25 is further connected to the ground conductor G.

A current flows from the positive electrode of the DC power source 10 successively through the first controller 21 and the ground conductor G, and the DC power source 10 supplies power to the first controller 21. The first controller 21 includes a first FET 30 (see FIG. 2) that functions as a semiconductor switch. The DC power source 10 supplies power to the first load 11 via the first FET 30. The microcomputer 26 outputs a first instruction signal having a high-level voltage or a low-level voltage to the first controller 21.

The first FET 30 included in the first controller 21 is switched ON when the voltage of the first instruction signal is switched from the low-level voltage to the high-level voltage in a state where a first load current flowing through the first load 11 is less than a predetermined first threshold current. As a result, a current flows from the positive electrode of the DC power source 10 successively through the first FET 30, the first load 11, and the ground conductor G, and power is supplied to the first load 11. When the voltage of the first instruction signal is switched from the high-level voltage to the low-level voltage or the first load current has risen to be greater than or equal to the first threshold current, the first FET 30 is switched OFF. As a result, power supply to the first load 11 stops and the first load 11 stops operation.

In the following description, the voltage at the positive electrode of the DC power source 10 will be referred to as "power source voltage". A reference potential of the power source voltage is the potential of the ground conductor G. The ground potential of the microcomputer 26 is the potential of the ground conductor G. The power source voltage fluctuates due to various factors. The first detection circuit 24 detects the power source voltage. The first detection circuit 24 outputs a voltage indicating the detected power source voltage as power source voltage information to the microcomputer 26. The microcomputer 26 switches the voltage of the first instruction signal to the high-level voltage or the low-level voltage in accordance with the power source voltage indicated by the power source voltage information. Thus, the first FET 30 is switched in accordance with the power source voltage.

The regulator 23 steps down the power source voltage to a predetermined voltage, and applies the stepped-down voltage to the microcomputer 26. As a result, a current flows from the positive electrode of the DC power source 10 successively through the regulator 23, the microcomputer 26, and the ground conductor G, and power is supplied to the microcomputer 26. A reference potential of the voltage stepped-down by the regulator 23 is the potential of the ground conductor G.

A current flows from the positive electrode of the DC power source 10 successively through the first lead wire resistor Rw1, the second controller 22, the second lead wire resistor Rw2, and the ground conductor G. The DC power source 10 supplies power to the second controller 22. The second controller 22 includes a second FET 40 (see FIG. 3) that functions as a semiconductor switch. The DC power source 10 supplies power to the second load 12 via the second FET 40. The microcomputer 26 outputs a second instruction signal having a high-level voltage or a low-level voltage to the second controller 22.

The second FET 40 is switched ON when the voltage of the second instruction signal is switched from the low-level voltage to the high-level voltage in a state where a second load current flowing through the second load 12 is less than a predetermined second threshold current. As a result, a current flows from the positive electrode of the DC power source 10 successively through the first lead wire resistor Rw1, the second FET 40, the second load 12, and the ground conductor G, and power is supplied to the second load 12. When the voltage of the second instruction signal is switched from the high-level voltage to the low-level voltage or the second load current has risen to be greater than or equal to the second threshold current, the second FET 40 is switched OFF. As a result, power supply to the second load 12 stops and the second load 12 stops operation.

As described above, the power supply control device 13 controls power supplied via the first FET 30 by switching the first FET 30 ON or OFF. Furthermore, the power supply control device 13 controls power supplied via the second FET 40 by switching the second FET 40 ON or OFF.

The first FET 30 and the second FET 40 are N-channel FETs. In each of the first FET 30 and the second FET 40, a current is input to the drain and is output from the source. In each of the first FET 30 and the second FET 40, the drain functions as an input terminal to which a current is input, and the source functions as an output terminal from which the current is output.

In the following description, the voltage at the drain of the second FET 40 will be referred to as "circuit voltage". A reference potential of the circuit voltage is the potential at the upstream end of the second lead wire resistor Rw2. When the power source voltage fluctuates, the circuit voltage also fluctuates. The second detection circuit 25 detects the circuit voltage, and outputs a voltage indicating the detected circuit voltage as circuit voltage information to the microcomputer 26. A reference potential of the circuit voltage information is the ground potential of the microcomputer 26, namely the potential of the ground conductor G. The microcomputer 26 switches the voltage of the second instruction signal to the high-level voltage or the low-level voltage in accordance with the circuit voltage indicated by the circuit voltage information. Thus, the second FET 40 is switched in accordance with the circuit voltage.

Configuration of First Controller 21

Figure 2:
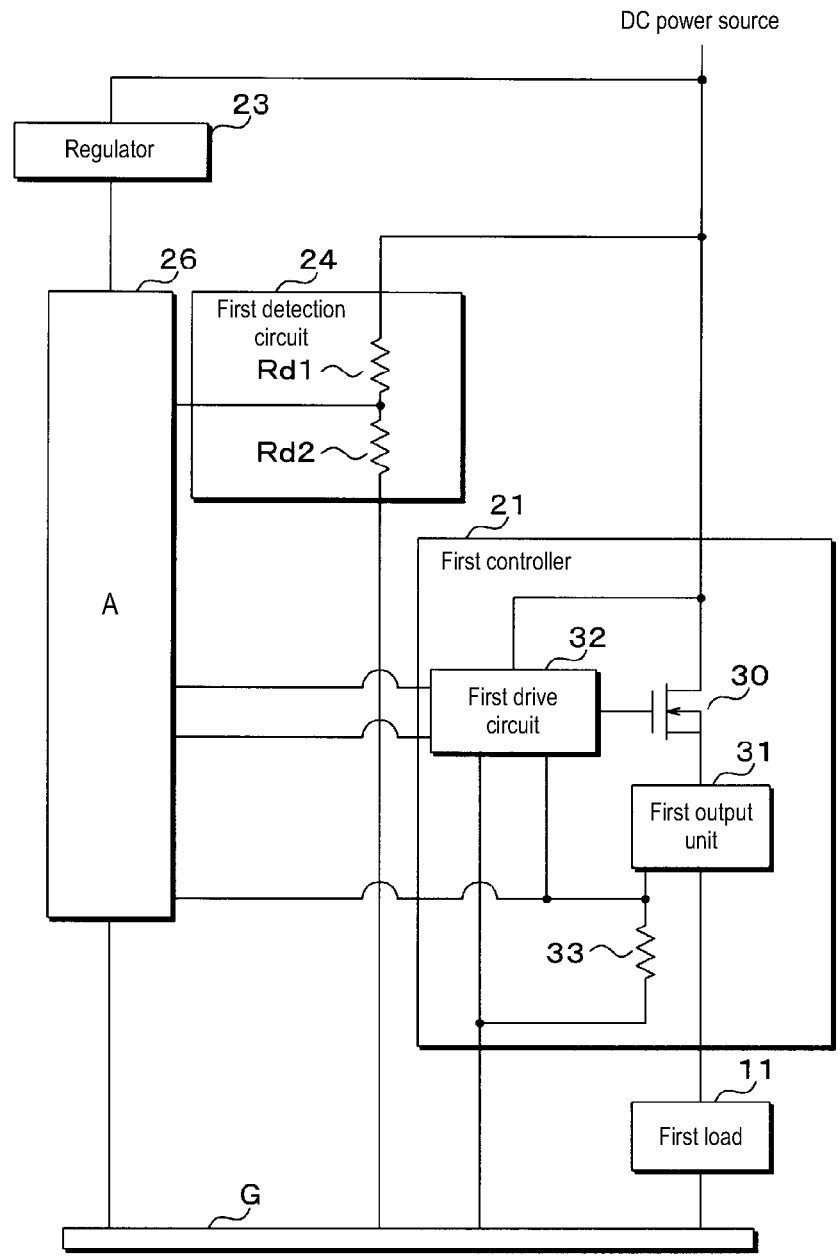
FIG. 2 is a circuit diagram of a first controller and a first detection circuit.

FIG. 2 is a circuit diagram of the first controller 21 and the first detection circuit 24. The first controller 21 includes a first output unit 31, a first drive circuit 32, and a first voltage resistor 33 in addition to the first FET 30. The drain of the first FET 30 is connected to the positive electrode of the DC power source 10. The source of the first FET 30 is connected to the first output unit 31. The first output unit 31 is further connected to the upstream end of the first load 11 and an end of the first voltage resistor 33. The drain and the gate of the first FET 30 are individually connected to the first drive circuit 32. The first drive circuit 32 is further connected to the microcomputer 26. A connection node between the first output unit 31 and the first voltage resistor 33 is connected to the microcomputer 26 and the first drive circuit 32. The first drive circuit 32 and the other end of the first voltage resistor 33 are connected to the ground conductor G.

When the voltage at the gate of the first FET 30 relative to the potential of the source is higher than or equal to a predetermined first switch voltage, a resistance value between the drain and the source of the first FET 30 is sufficiently small. At this time, the first FET 30 is ON, and a current can flow through the drain and the source of the first FET 30. When the first FET 30 is ON, a current flows from the positive electrode of the DC power source 10 successively through the first FET 30, the first output unit 31, the first load 11, and the ground conductor G. When the voltage at the gate of the first FET 30 relative to the potential of the source is lower than the first switch voltage, a resistance value between the drain and the source of the first FET 30 is sufficiently large. At this time, the first FET 30 is OFF, and no current flows through the drain and the source of the first FET 30.

A current flows from the positive electrode of the DC power source 10 successively through the first drive circuit 32 and the ground conductor G, and power is supplied to the first drive circuit 32. The first drive circuit 32 operates when the power source voltage has risen and become higher than or equal to a predetermined first operation voltage. When the power source voltage has dropped and become lower than the first operation voltage, the first drive circuit 32 stops operation. The ground potential of the first drive circuit 32 is the potential of the ground conductor G.

The first drive circuit 32 steps up the power source voltage and applies the stepped-up voltage to the gate of the first FET 30. As a result, the voltage at the gate of the first FET 30 relative to the potential of the source rises and becomes higher than or equal to the first switch voltage. As a result, the first FET 30 is switched ON. A reference potential of the stepped-up voltage is the potential of the ground conductor G. When the first drive circuit 32 stops stepping up the power source voltage, the voltage at the gate of the first FET 30 relative to the potential of the source drops to be lower than the first switch voltage. As a result, the first FET 30 is switched OFF. As described above, the first drive circuit 32 switches the first FET 30 ON or OFF by adjusting the voltage at the gate of the first FET 30.

The first output unit 31 is constituted by a current mirror circuit, for example, and outputs, to the first voltage resistor 33, a current that is proportional to the first load current flowing through the first FET 30 to the first load 11. The resistance value of the first voltage resistor 33 is constant. Therefore, the voltage between two ends of the first voltage resistor 33 is proportional to the current flowing through the first voltage resistor 33. Accordingly, the voltage between the two ends of the first voltage resistor 33 is proportional to the first load current. The voltage between the two ends of the first voltage resistor 33 is output as first current information indicating the first load current, to the microcomputer 26 and the first drive circuit 32.

As described above, the microcomputer 26 outputs a first instruction signal to the first drive circuit 32. The first drive circuit 32 switches the first FET 30 ON when the voltage of the first instruction signal is switched from the low-level voltage to the high-level voltage in a state where the first load current indicated by the first current information is less than the first threshold current. The first drive circuit 32 switches the first FET 30 OFF when the voltage of the first instruction signal is switched from the high-level voltage to the low-level voltage or the first load current indicated by the first current information has risen to be greater than or equal to the first threshold current.

The microcomputer 26 communicates with the first drive circuit 32. The microcomputer 26 can determine whether or not the first drive circuit 32 is operating, by communicating with the first drive circuit 32. For example, the microcomputer 26 transmits a request signal to the first drive circuit 32 to request transmission of a response signal. The microcomputer 26 determines whether or not the first drive circuit 32 is operating based on whether or not the response signal is received from the first drive circuit 32.

Configuration of First Detection Circuit 24

The first detection circuit 24 includes two voltage-dividing resistors Rd1 and Rd2. An end of the voltage-dividing resistor Rd1 is connected to the positive electrode of the DC power source 10. The other end of the voltage-dividing resistor Rd1 is connected to an end of the voltage-dividing resistor Rd2. The other end of the voltage-dividing resistor Rd2 is connected to the ground conductor G. A connection node between the two voltage-dividing resistors Rd1 and Rd2 is connected to the microcomputer 26.

The first detection circuit 24 divides the power source voltage. The resistance values of the two voltage-dividing resistors Rd1 and Rd2 are constant. Accordingly, a voltage obtained as a result of the first detection circuit 24 dividing the power source voltage is proportional to the power source voltage. The first detection circuit 24 detects the power source voltage by dividing the power source voltage. The first detection circuit 24 outputs the voltage obtained by dividing the power source voltage as power source voltage information to the microcomputer 26. As described above, the microcomputer 26 switches the voltage of the first instruction signal to the high-level voltage or the low-level voltage in accordance with the power source voltage indicated by the power source voltage information.

Configuration of Second Controller 22

Figure 3:
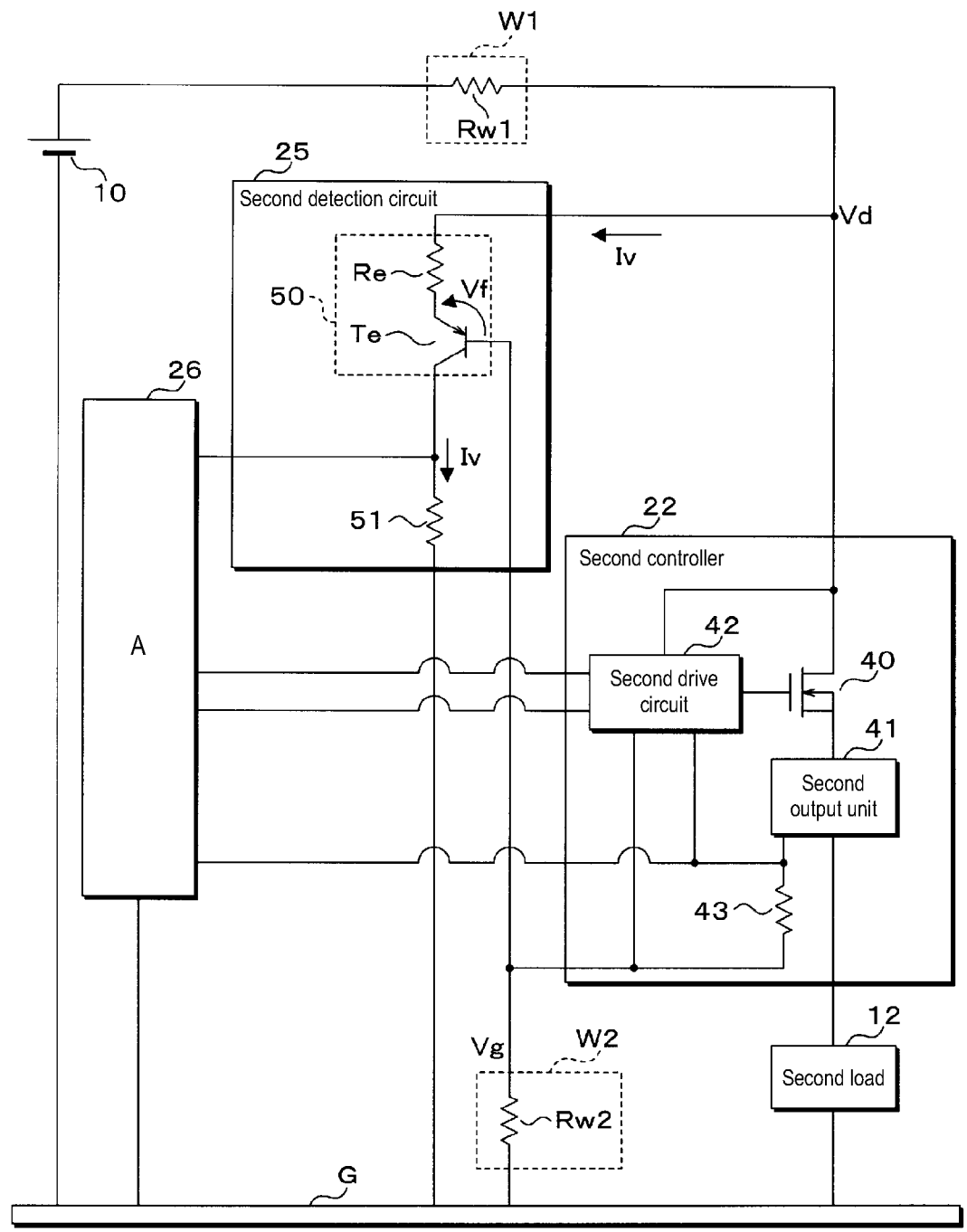
FIG. 3 is a circuit diagram of a second controller and a second detection circuit.

FIG. 3 is a circuit diagram of the second controller 22 and the second detection circuit 25. The second controller 22 includes a second output unit 41, a second drive circuit 42, and a second voltage resistor 43 in addition to the second FET 40. The drain of the second FET 40 is connected to the downstream end of the first lead wire resistor Rw1. The upstream end of the first lead wire resistor Rw1 is connected to the positive electrode of the DC power source 10. The source of the second FET 40 is connected to the second output unit 41. The second output unit 41 is further connected to the upstream end of the second load 12 and an end of the second voltage resistor 43. The drain and the gate of the second FET 40 are individually connected to the second drive circuit 42. The second drive circuit 42 is further connected to the microcomputer 26. A connection node between the second output unit 41 and the second voltage resistor 43 is connected to the microcomputer 26 and the second drive circuit 42. The second drive circuit 42 and the other end of the second voltage resistor 43 are connected to the upstream end of the second lead wire resistor Rw2. As described above, the downstream end of the second lead wire resistor Rw2 is connected to the ground conductor G.

When the voltage at the gate of the second FET 40 relative to the potential of the source is higher than or equal to a predetermined second switch voltage, a resistance value between the drain and the source of the second FET 40 is sufficiently small. At this time, the second FET 40 is ON, and a current can flow through the drain and the source of the second FET 40. When the second FET 40 is ON, a current flows from the positive electrode of the DC power source 10 successively through the second FET 40, the second output unit 41, the second load 12, and the ground conductor G. When the voltage at the gate of the second FET 40 relative to the potential of the source is lower than the second switch voltage, a resistance value between the drain and the source of the second FET 40 is sufficiently large. At this time, the second FET 40 is OFF, and no current flows through the drain and the source of the second FET 40.

A current flows from the positive electrode of the DC power source 10 successively through the first lead wire resistor Rw1, the second drive circuit 42, the second lead wire resistor Rw2, and the ground conductor G. Thus, power is supplied to the second drive circuit 42. The second drive circuit 42 operates when the circuit voltage has risen and become higher than or equal to a predetermined second operation voltage. The second drive circuit 42 stops operation when the circuit voltage has dropped and become lower than the second operation voltage. The ground potential of the second drive circuit 42 is the potential at the upstream end of the second lead wire resistor Rw2. While power is supplied to the second drive circuit 42, a current flows from the drain of the second FET 40 successively through the second drive circuit 42 and the ground of the second drive circuit 42.

The second drive circuit 42 adjusts the voltage at the gate relative to the ground potential of the second drive circuit 42. As described above, the reference potential of the circuit voltage is the potential at the upstream end of the second lead wire resistor Rw2, namely the ground potential of the second drive circuit 42. The second drive circuit 42 steps up the circuit voltage and applies the stepped-up voltage to the gate of the second FET 40. Consequently, the voltage at the gate of the second FET 40 relative to the potential of the source rises and becomes higher than or equal to the second switch voltage. As a result, the second FET 40 is switched ON. A reference potential of the stepped-up voltage is the ground potential of the second drive circuit 42.

The second drive circuit 42 stops stepping up the circuit voltage. As a result, the voltage at the gate relative to the ground potential of the second drive circuit 42 drops. Consequently, the voltage at the gate of the second FET 40 relative to the potential of the source drops to be lower than the second switch voltage. As a result, the second FET 40 is switched OFF.

The second output unit 41 is constituted by a current mirror circuit, for example, and outputs a current that is proportional to the second load current flowing through the second FET 40 to the second load 12. The second output unit 41 functions as a current output unit. The current output from the second output unit 41 flows via the second voltage resistor 43 and the second lead wire resistor Rw2. The resistance value of the second voltage resistor 43 is constant. Therefore, a voltage between two ends of the second voltage resistor 43 is proportional to a current flowing through the second voltage resistor 43. Accordingly, the voltage between the two ends of the second voltage resistor 43 is proportional to the second load current. The voltage between the two ends of the second voltage resistor 43 is output as second current information indicating the second load current, to the second drive circuit 42.

The resistance value of the second lead wire resistor Rw2 is also constant. Therefore, a voltage between two ends of a series circuit in which the second voltage resistor 43 and the second lead wire resistor Rw2 are connected in series is proportional to a current flowing through the second voltage resistor 43. Accordingly, the voltage between the two ends of the series circuit is proportional to the second load current. The voltage between the two ends of the series circuit is output as further second current information indicating the second load current, to the microcomputer 26.

As described above, the microcomputer 26 outputs a second instruction signal to the second drive circuit 42. The second drive circuit 42 switches the second FET 40 ON when the voltage of the second instruction signal is switched from the low-level voltage to the high-level voltage in a state where the second load current indicated by the second current information is less than the second threshold current. The second drive circuit 42 switches the second FET 40 OFF when the voltage of the second instruction signal is switched from the high-level voltage to the low-level voltage or the second load current indicated by the second current information has risen to be greater than or equal to the second threshold current.

The microcomputer 26 communicates with the second drive circuit 42 as well as the first drive circuit 32. The microcomputer 26 can determine whether or not the second drive circuit 42 is operating, by communicating with the second drive circuit 42. For example, the microcomputer 26 transmits a request signal to the second drive circuit 42 to request transmission of a response signal, and determines whether or not the second drive circuit 42 is operating based on whether or not a response signal is received from the second drive circuit 42.

Configuration of Second Detection Circuit 25

The second detection circuit 25 includes a current output device 50 and a circuit resistor 51. The current output device 50 includes a device resistor Re and a transistor Te. The transistor Te is a PNP bipolar transistor.

An end of the device resistor Re is connected to the drain of the second FET 40. The other end of the device resistor Re is connected to the emitter of the transistor Te. The base of the transistor Te is connected to the upstream end of the second lead wire resistor Rw2. Accordingly, the potential of the base of the transistor Te is the ground potential of the second drive circuit 42. The collector of the transistor Te is connected to the microcomputer 26 and an end of the circuit resistor 51. The other end of the circuit resistor 51 is connected to the ground conductor G.

A current flows from the positive electrode of the DC power source 10 successively through the first lead wire resistor Rw1, the device resistor Re, the transistor Te, the circuit resistor 51, and the ground conductor G. Accordingly, the current flows to the device resistor Re from the downstream end of the first lead wire resistor Rw1, namely the drain of the second FET 40. In the transistor Te, the current flows successively through the emitter and the collector. The emitter of the transistor Te is connected to the downstream end of the device resistor Re.

A very small portion of the current input from the device resistor Re to the emitter of the transistor Te flows from the base via the second lead wire resistor Rw2 to the ground conductor G. Substantially the total current input to the emitter is output from the collector. Therefore, the current output from the base is negligible, and the current input to the emitter substantially matches the current output from the collector.

The voltage at the drain of the second FET 40 is denoted by Vd. The voltage at the upstream end of the second lead wire resistor Rw2 is denoted by Vg.

Reference potentials of the voltages Vd and Vg are the potential of the ground conductor G. (Vd−Vg) represents the circuit voltage. The resistance value of the device resistor Re is denoted by re. The voltage (an absolute value of the voltage) between the base and the emitter of the transistor Te is denoted by Vf. A current flowing through the device resistor Re is denoted by Iv.

The transistor Te adjusts a resistance value between the emitter and the collector in such a manner that the voltage at the emitter relative to the potential of the ground conductor G becomes (Vg+Vf). Consequently, the transistor Te adjusts the resistance value between the emitter and the collector in such a manner that the current Iv satisfies the following Equation (1).

$$Iv = (Vd - (Vg + Vf))/re \qquad (1)$$

As described above, substantially the total current input to the emitter is output from the collector. Accordingly, the current flowing through the circuit resistor 51 substantially matches the current Iv.

The following Equation (2) is obtained by developing the Equation (1).

$$Iv = ((Vd - Vg) - Vf)/re \qquad (2)$$

As described above, (Vd–Vg) represents the circuit voltage. The voltage Vf and the resistance value re are substantially constant values, and therefore, the current Iv is proportional to the circuit voltage. Accordingly, the current output device 50 converts the circuit voltage to a current Iv that is proportional to the circuit voltage, and outputs the converted current Iv to the circuit resistor 51. The current Iv is drawn from the drain of the second FET 40. The current Iv output from the collector of the transistor Te included in the current output device 50 flows via the circuit resistor 51. The current output device 50 detects the circuit voltage by outputting the current Iv.

The resistance value of the circuit resistor 51 is denoted by rc. A voltage between two ends of the circuit resistor 51 is denoted by Vc. The voltage Vc is expressed by the following Equation (3).

$$Vc = rc \cdot Iv \qquad (3)$$

represents multiplication. When the current Iv is eliminated by substituting the Equation (2) into the Equation (3), the following Equation (4) is satisfied with respect to the voltage Vc.

$$Vc = ((Vd - Vg) - Vf) \cdot rc/re \qquad (4)$$

As described above, (Vd–Vg) represents the circuit voltage. Not only the voltage Vf and the resistance value re but also the resistance value rc is substantially constant. Therefore, the voltage Vc is proportional to the circuit voltage. Since the voltage Vf and the resistance values rc and re are substantially constant, it is possible to calculate the circuit voltage, namely (Vd–Vg) by substituting the voltage Vc into the Equation (4).

As described above, the second detection circuit 25 detects the circuit voltage and outputs the voltage Vc, which is proportional to the detected circuit voltage, as circuit voltage information to the microcomputer 26. The microcomputer 26 calculates the circuit voltage based on the circuit voltage information, namely the voltage Vc, and the Equation (4). The ground potential of the microcomputer 26 is the potential of the ground conductor G as described above, and differs from the ground potential of the second drive circuit 42. However, the current output device 50 included in the second detection circuit 25 converts the circuit voltage to the current Iv, and therefore, the microcomputer 26 can calculate the circuit voltage.

While power is supplied to the second drive circuit 42, a current flows from the positive electrode of the DC power source 10 successively through the first lead wire resistor Rw1, the second drive circuit 42, the second lead wire resistor Rw2, and the ground conductor G. The downstream end of the circuit resistor 51 is connected to the ground conductor G. As described above, the potential at the upstream end of the second lead wire resistor Rw2 is the ground potential of the second drive circuit 42. While power is supplied to the second drive circuit 42, a current flows via the second lead wire resistor Rw2, and therefore, a voltage between the ground of the second drive circuit 42 and the downstream end of the circuit resistor 51 is higher than 0 V.

As described above, the current output from the second output unit 41 is proportional to the second load current and flows via the second lead wire resistor Rw2. Therefore, when the second FET 40 is OFF, the current output from the second output unit 41 is 0 A. When the second FET 40 is switched ON, the current output from the second output unit 41 increases. As a result, the current flowing through the second lead wire resistor Rw2 also increases. Also, when the second FET 40 is OFF, only a current that flows via the second drive circuit 42 flows through the first lead wire resistor Rw1, and this current is small. When the second FET 40 is switched ON, the sum of the current flowing through the second drive circuit 42 and the current that flows through the second FET 40 flows through the first lead wire resistor Rw1. For the reasons described above, the circuit voltage is higher when the second FET 40 is OFF than when the second FET 40 is ON.

As described above, the current output from the second output unit 41 flows through the second lead wire resistor Rw2. Therefore, the voltage between the two ends of the second lead wire resistor Rw2, namely the voltage between the ground of the second drive circuit 42 and the downstream end of the circuit resistor 51 fluctuates in accordance with the current output from the second output unit 41.

Configuration of Microcomputer 26

Figure 4:
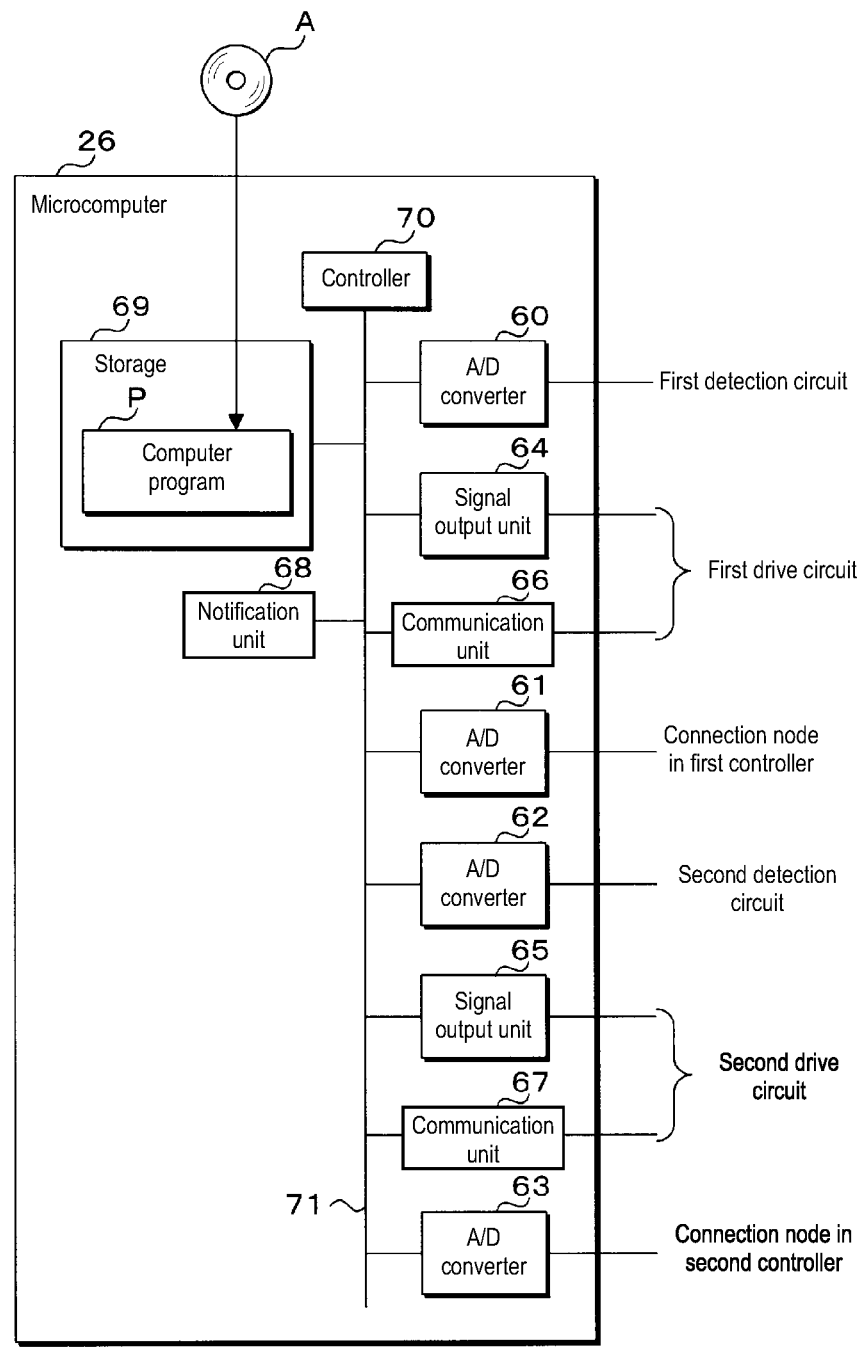
FIG. 4 is a block diagram showing the configuration of the main part of a microcomputer.

FIG. 4 is a block diagram showing the configuration of the main part of the microcomputer 26. The microcomputer 26 includes A/D converters 60, 61, 62, and 63, signal output units 64 and 65, communication units 66 and 67, a notification unit 68, a storage 69, and a controller 70. The A/D converters 60, 61, 62, and 63, the signal output units 64 and 65, the communication units 66 and 67, the notification unit 68, the storage 69, and the controller 70 are connected to an internal bus 71.

The A/D converter 60 is further connected to the connection node between the voltage-dividing resistors Rd1 and Rd2 included in the first detection circuit 24. The signal output unit 64 and the communication unit 66 are further connected to the first drive circuit 32. The A/D converter 61 is further connected to the connection node between the first output unit 31 and the first voltage resistor 33 included in the first controller 21. The A/D converter 62 is further connected to the upstream end of the circuit resistor 51 included in the second detection circuit 25. The signal output unit 65 and the communication unit 67 are further connected to the second drive circuit 42. The A/D converter 63 is connected to the connection node between the second output unit 41 and the second voltage resistor 43 included in the second controller 22.

Analog power source voltage information is input from the first detection circuit 24 to the A/D converter 60. The A/D converter 60 converts the input analog power source voltage information to digital power source voltage information. The controller 70 obtains the digital power source voltage information from the A/D converter 60.

The signal output unit 64 outputs a first instruction signal to the first drive circuit 32. The signal output unit 64 switches the voltage of the first instruction signal to the high-level voltage or the low-level voltage in accordance with instructions from the controller 70.

The communication unit 66 transmits a signal to the first drive circuit 32 in accordance with instructions from the controller 70. Furthermore, the communication unit 66 receives a signal from the first drive circuit 32.

Analog first current information is input from the first controller 21 to the A/D converter 61. The A/D converter 61 converts the input analog first current information to digital first current information. The controller 70 obtains the digital first current information from the A/D converter 61.

Analog circuit voltage information is input from the second detection circuit 25 to the A/D converter 62. The A/D converter 62 converts the input analog circuit voltage information to digital circuit voltage information. The controller 70 obtains the digital circuit voltage information from the A/D converter 62.

The signal output unit 65 outputs a second instruction signal to the second drive circuit 42. The signal output unit 65 switches the voltage of the second instruction signal to the high-level voltage or the low-level voltage in accordance with instructions from the controller 70.

The communication unit 67 transmits a signal to the second drive circuit 42 in accordance with instructions from the controller 70. Furthermore, the communication unit 67 receives a signal from the second drive circuit 42.

Analog second current information is input from the second controller 22 to the A/D converter 63. The A/D converter 63 converts the input analog second current information to digital second current information. The controller 70 obtains the digital second current information from the A/D converter 63.

The notification unit 68 gives notifications in accordance with instructions from the controller 70. The notifications are given by transmitting a signal, lighting a lamp, or displaying a message, for example.

The storage 69 is a nonvolatile memory, for example. A computer program P is stored in the storage 69. The controller 70 includes a processing unit that executes processing, such as a CPU (Central Processing Unit). The processing unit of the controller 70 executes first fault detection processing, first power supply control processing, second fault detection processing, second power supply control processing, and the like by executing the computer program P. The controller 70 functions as a processor.

The first fault detection processing is processing for detecting a fault relating to the first controller 21 or the first detection circuit 24. The first power supply control processing is processing for controlling power supply to the first load 11. The second fault detection processing is processing for detecting a fault relating to the second controller 22 or the second detection circuit 25. The second power supply control processing is processing for controlling power supply to the second load 12.

Note that the computer program P may also be stored in a storage medium A in such a manner that the processing unit of the controller 70 can read the program. In this case, the computer program P read out from the storage medium A by a reading device (not shown) is written into the storage 69. Examples of the storage medium A include an optical disk, a flexible disk, a magnetic disk, a magneto-optical disk, and a semiconductor memory. Examples of the optical disk include a CD (Compact Disc)-ROM (Read Only Memory), a DVD (Digital Versatile Disc)-ROM, and a BD (Blu-ray (registered trademark)) Disc. An example of the magnetic disk is a hard disk. It is also possible to download the computer program P from a device (not shown) that is connected to a communication network (not shown), and write the downloaded computer program P into the storage 69.

The number of processing units included in the controller 70 is not limited to one, and may be two or more. In this case, a configuration is also possible in which the plurality of processing units execute the first fault detection processing, the first power supply control processing, the second fault detection processing, the second power supply control processing, and the like in cooperation with each other, following the computer program P.

The technology of the present disclosure differs from conventional technologies mainly with regard to the second fault detection processing and the second power supply control processing. Therefore, the following first describes the second fault detection processing and the second power supply control processing. Thereafter, differences between the first fault detection processing and the second fault detection processing will be described to explain the first fault detection processing. Also, differences between the first power supply control processing and the second power supply control processing will be described to explain the first power supply control processing. These types of processing will be described on the assumption that the first load current does not rise to be greater than or equal to the first threshold current and the second load current does not rise to be greater than or equal to the second threshold current.

Second Fault Detection Processing

Figure 5:
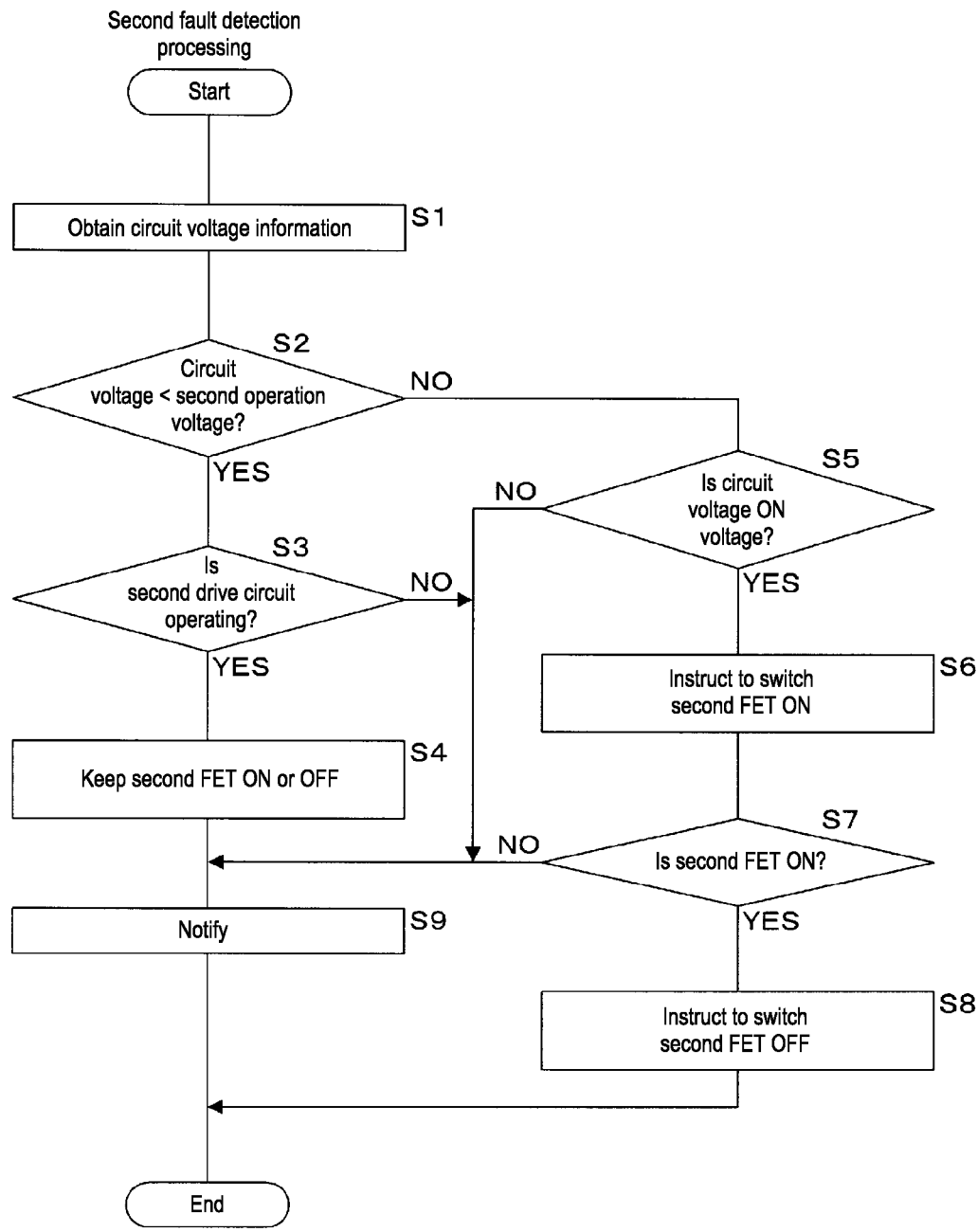
FIG. 5 is a flowchart showing the procedure of second fault detection processing.

FIG. 5 is a flowchart showing the procedure of the second fault detection processing. The controller 70 executes the second fault detection processing before causing the second load 12 to operate. For example, the controller 70 executes the second fault detection processing when the engine of the vehicle is started while the second load 12 is not operating. Accordingly, the second fault detection processing is executed while the second FET 40 is OFF. If no fault is detected in the second fault detection processing, the controller 70 executes the second power supply control processing.

In the second fault detection processing, the controller 70 obtains circuit voltage information from the A/D converter 62 (step S1). The circuit voltage information obtained in step S1 is the voltage that is output from the second detection circuit 25 while the second FET 40 is OFF. The circuit voltage indicated by the circuit voltage information obtained in step S1 is higher than the circuit voltage when the second FET 40 is ON. Next, the controller 70 determines whether or not the circuit voltage indicated by the circuit voltage information obtained in step S1 is lower than the second operation voltage (step S2). The second drive circuit 42 ceases to operate when the circuit voltage is lower than the second operation voltage. The second operation voltage serves as a threshold voltage.

If it is determined that the circuit voltage indicated by the circuit voltage information is lower than the second operation voltage (S2: YES), the controller 70 determines whether or not the second drive circuit 42 is operating (step S3). If the second drive circuit 42 is operating when step S3 is executed, this means that the second detection circuit 25 did not output an appropriate voltage, namely a fault has occurred in the second detection circuit 25. The controller 70 can detect a fault in the second detection circuit 25 by executing step S2.

It is possible to determine whether or not the second drive circuit 42 is operating through communications, for example. In this method, the controller 70 causes the communication unit 66 to transmit a request signal to the second drive circuit 42 to request transmission of a response signal, for example. If the communication unit 66 receives a response signal in a predetermined period from when the request signal is transmitted, the controller 70 determines that the second drive circuit 42 is operating. If the communication unit 66 does not receive a response signal in the predetermined period from when the request signal is transmitted, the controller 70 determines that the second drive circuit 42 is not operating.

Alternatively, it is possible to determine whether or not the second drive circuit 42 is operating by confirming the state of the second FET 40. In this method, the controller 70 instructs the signal output unit 65 to switch the voltage of the second instruction signal from the low-level voltage to the high-level voltage, for example. The controller 70 obtains second current information from the A/D converter 63 while the second instruction signal has the high-level voltage, and then instructs the signal output unit 65 to return the voltage of the second instruction signal to the low-level voltage. If the second load current indicated by the second current information is greater than or equal to a predetermined value, this means that the second FET 40 is ON. If the second load current indicated by the second current information is less than the predetermined value, this means that the second FET 40 is OFF. If the second load current indicated by the second current information is greater than or equal to the predetermined value, the controller 70 determines that the second drive circuit 42 is operating. If the second load current indicated by the second current information is less than the predetermined value, the controller 70 determines that the second drive circuit 42 is not operating.

If it is determined that the second drive circuit 42 is operating (S3: YES), the controller 70 determines that a fault has occurred in the second detection circuit 25 and keeps the second FET 40 ON or OFF (step S4). The controller 70 keeps the second FET 40 ON by instructing the signal output unit 65 to keep the voltage of the second instruction signal at the high-level voltage. The controller 70 keeps the second FET 40 OFF by instructing the signal output unit 65 to keep the voltage of the second instruction signal at the low-level voltage.

The second FET is kept ON or OFF depending on the properties of the second load 12. In the case where no problem occurs in driving even if the second load 12 stops operation, such as a case where the second load 12 is a room lamp, the controller 70 keeps the second FET 40 OFF in step S4. In cases where a problem may occur in driving if the second load 12 stops operation, such as a case where the second load 12 is a headlight, the controller 70 keeps the second FET 40 ON in step S4.

If it is determined that the circuit voltage indicated by the circuit voltage information is higher than or equal to the second operation voltage (S2: NO), the controller 70 determines whether or not the circuit voltage indicated by the circuit voltage information obtained in step S1 is an ON voltage (step S5). If the circuit voltage is too low, the second drive circuit 42 cannot step up the circuit voltage to a voltage with which the second FET 40 can be switched ON. The ON voltage is a voltage that falls within a range set in advance and can be stepped up to a voltage with which the second FET 40 can be switched ON. If the circuit voltage is the ON voltage while the second FET 40 is OFF, the circuit voltage is high even when the second FET 40 is switched ON, and the second drive circuit 42 can switch the second FET 40 ON. If it is determined that the circuit voltage is the ON voltage (S5: YES), the controller 70 instructs the signal output unit 65 to switch the second FET 40 ON (step S6). Specifically, the controller 70 instructs the signal output unit 65 to switch the voltage of the second instruction signal from the low-level voltage to the high-level voltage. As a result, the second drive circuit 42 switches the second FET 40 ON.

Next, the controller 70 determines whether or not the second FET 40 is ON, based on a second load current indicated by second current information obtained from the A/D converter 63 (step S7). In step S7, if the second load current is greater than or equal to a predetermined value, the controller 70 determines that the second FET 40 is ON. If the second load current is less than the predetermined value, the controller 70 determines that the second FET 40 is not ON. The controller 70 confirms whether or not the second FET 40 can be switched ON, by executing steps S6 and S7.

If it is determined that the second FET 40 is ON (S7: YES), the controller 70 instructs the signal output unit 65 to switch the second FET 40 OFF (step S8). Specifically, the controller 70 instructs the signal output unit 65 to switch the voltage of the second instruction signal to the low-level voltage. As a result, the second drive circuit 42 switches the second FET 40 OFF. After executing step S8, the controller 70 ends the second fault detection processing. Upon ending the second fault detection processing after executing step S8, the controller 70 executes the second power supply control processing.

The controller 70 causes the notification unit 68 to give a notification (step S9) if it is determined that the second drive circuit is not operating (S3: NO), after executing step S4, if it is determined that the circuit voltage is not the ON voltage (S5: NO), or if it is determined that the second FET 40 is not ON (S7: NO). If it is determined that the second drive circuit is not operating or that the circuit voltage is not the ON voltage, the controller 70 instructs the notification unit 68 to output a signal indicating that the circuit voltage is low to a device (not shown), for example.

If the notification is given after step S4 is executed, a signal indicating the occurrence of a fault in the second detection circuit 25 is output to the device, for example. If it is determined that the second FET 40 is not ON, the controller 70 instructs the notification unit 68 to output a signal indicating the occurrence of a fault in the second detection circuit 25 or the second drive circuit 42 to the device, for example.

After executing step S9, the controller 70 ends the second fault detection processing. If the second fault detection processing is ended after step S9 is executed, the controller 70 does not execute the second power supply control processing.

Second Power Supply Control Processing

Figure 6:
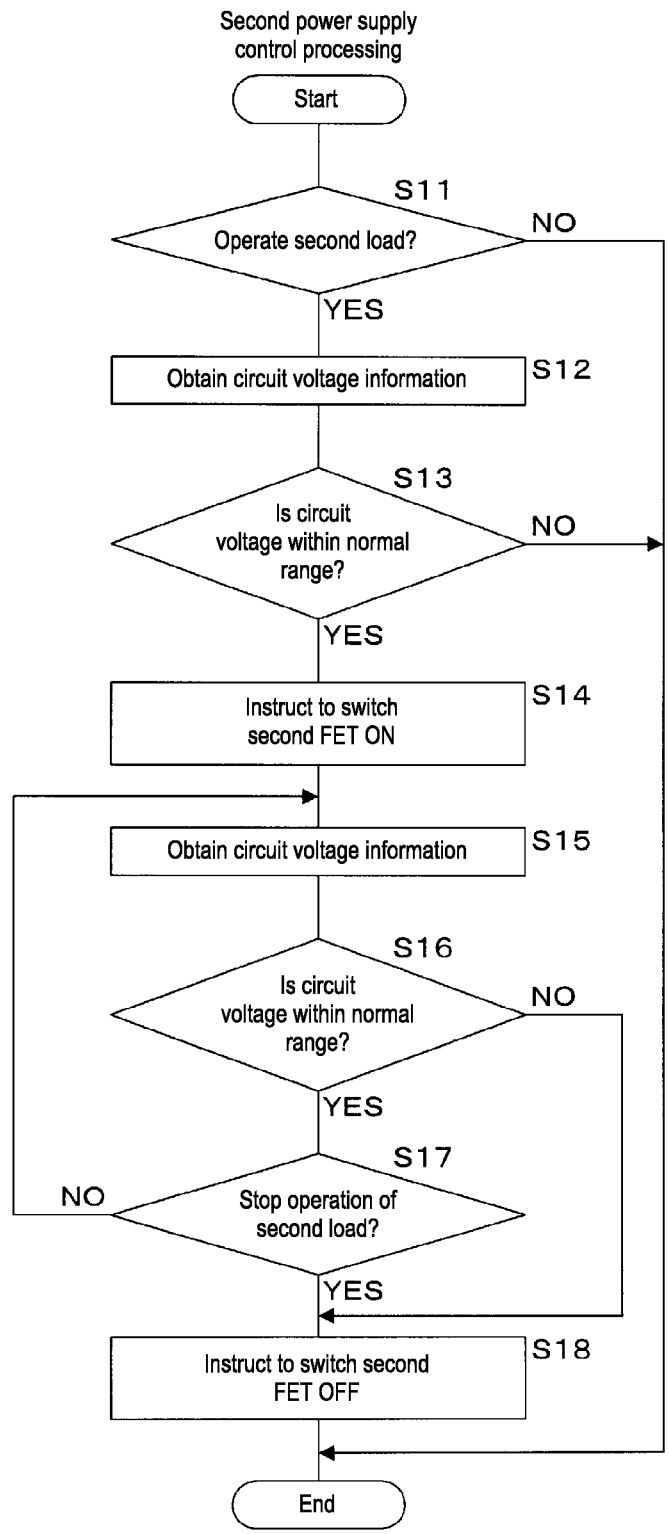
FIG. 6 is a flowchart showing the procedure of second power supply control processing.

FIG. 6 is a flowchart showing the procedure of the second power supply control processing. The second power supply control processing is executed while the second FET 40 is OFF. In the second power supply control processing, the controller 70 determines whether or not to cause the second load 12 to operate (step S11). If a reception device (not shown) has received an instruction to operate the second load 12, the controller 70 determines to cause the second load 12 to operate. If the reception device has not received an instruction to operate the second load 12, the controller 70 determines not to cause the second load 12 to operate.

If it is determined not to cause the second load 12 to operate (S11: NO), the controller 70 ends the second power supply control processing and again starts the second power supply control processing. Therefore, when determining not to cause the second load 12 to operate in step S11, the controller 70 again executes step S11.

If it is determined to cause the second load 12 to operate (S11: YES), the controller 70 obtains circuit voltage information from the A/D converter 62 (step S12). The circuit voltage indicated by the circuit voltage information obtained in step S12 is the circuit voltage when the second FET 40 is OFF. Next, the controller 70 determines whether or not the circuit voltage indicated by the circuit voltage information obtained in step S12 falls within a normal range (step S13). The normal range is a range of the circuit voltage that enables the second drive circuit 42 to appropriately switch the second FET 40 ON or OFF.

If it is determined that the circuit voltage falls within the normal range (S13: YES), the controller 70 instructs the signal output unit 65 to switch the second FET 40 ON (step S14) as in step S6 of the second fault detection processing. As a result, power is supplied to the second load 12 and the second load 12 operates. After executing step S14, the controller 70 obtains circuit voltage information from the A/D converter 62 (step S15). The circuit voltage indicated by the circuit voltage information obtained in step S15 is the circuit voltage when the second FET 40 is ON.

Next, the controller 70 determines whether or not the circuit voltage indicated by the circuit voltage information obtained in step S15 falls within the normal range (step S16). If it is determined that the circuit voltage falls within the normal range (S16: YES), the controller 70 determines whether or not to stop operation of the second load 12 (step S17). For example, if the reception device has received an instruction to stop operation of the second load 12, the controller 70 determines to stop operation of the second load 12. If the reception device has not received an instruction to stop operation of the second load 12, the controller 70 determines not to stop operation of the second load 12.

If it is determined not to stop operation of the second load 12 (S17: NO), the controller 70 again executes step S15, and executes steps S16 and S17 repeatedly until the circuit voltage changes to a voltage that does not fall within the normal range or operation of the second load 12 is stopped. If it is determined that the circuit voltage does not fall within the normal range (S16: NO) or if it is determined to stop operation of the second load 12 (S17: YES), the controller 70 instructs the signal output unit 65 to switch the second FET 40 OFF (step S18) as in step S8 of the second fault detection processing, and ends the second power supply control processing. After ending the second power supply control processing, the controller 70 again executes the second power supply control processing. The controller 70 stops repeating the second power supply control processing when the engine is stopped, for example.

As described above, in the second power supply control processing, the controller 70 instructs the signal output unit 65 to switch the second FET 40 ON or OFF in accordance with a circuit voltage indicated by circuit voltage information output from the second detection circuit 25. The second drive circuit 42 switches the second FET 40 ON or OFF following the instruction from the controller 70. Therefore, the second FET 40 is appropriately switched ON or OFF by the second drive circuit 42 in accordance with the circuit voltage detected by the second detection circuit 25. Power supply to the second load 12 is appropriately controlled. The second drive circuit 42 functions as a switching circuit.

First Fault Detection Processing and First Power Supply Control Processing

The controller 70 executes the first fault detection processing similarly to the second fault detection processing.

The controller 70 executes the first power supply control processing similarly to the second power supply control processing. The second FET 40, the second drive circuit 42, the circuit voltage information, the second operation voltage, and the second current information referred to in the descriptions of the second fault detection processing and the second power supply control processing respectively correspond to the first FET 30, the first drive circuit 32, the power source voltage information, the first operation voltage, and the first current information in the first fault detection processing and the first power supply control processing.

Also, the A/D converters 62 and 63, the signal output unit 65, and the communication unit 67 referred to in the descriptions of the second fault detection processing and the second power supply control processing respectively correspond to the A/D converters 60 and 61, the signal output unit 64, and the communication unit 66 in the first fault detection processing and the first power supply control processing. A normal range in the first power supply control processing is a range of the power source voltage that enables the first drive circuit 32 to appropriately switch the first FET 30 ON or OFF.

Second Embodiment

In the second power supply control processing according to the first embodiment, the second drive circuit 42 switches the second FET 40 ON or OFF based on whether or not the circuit voltage falls within the normal range. However, there is no limitation to a configuration in which the second FET 40 is switched based on whether or not the circuit voltage falls within the normal range.

The following describes differences of a second embodiment from the first embodiment. Configurations other than those described below are the same as those in the first embodiment. Therefore, structural features that are the same as those in the first embodiment are denoted by the same reference signs as those used in the first embodiment, and descriptions of those structural features are omitted.

Configuration of Microcomputer 26

In the second embodiment, the signal output unit 65 shown in FIG. 4 outputs not the second instruction signal but a second PWM signal to the second drive circuit 42. Similarly to the second instruction signal, the second PWM signal has a high-level voltage or a low-level voltage. Similarly to the first embodiment, the second drive circuit 42 switches the second FET 40 ON when the voltage of the second PWM signal is switched from the low-level voltage to the high-level voltage. The second drive circuit 42 switches the second FET 40 OFF when the voltage of the second PWM signal is switched from the high-level voltage to the low-level voltage. The second drive circuit 42 keeps the second FET 40 OFF while output of the second PWM signal is stopped.

The voltage of the second PWM signal is periodically switched from the low-level voltage to the high-level voltage. The duty cycle of the second PWM signal is adjusted by adjusting timings at which the high-level voltage is switched to the low-level voltage. The duty cycle is the ratio of a time for which the second PWM signal has the high-level voltage in a period.

Note that a configuration is also possible in which the voltage of the second PWM signal is periodically switched from the high-level voltage to the low-level voltage. In this case, the duty cycle of the second PWM signal is adjusted by adjusting timings at which the low-level voltage is switched to the high-level voltage.

The signal output unit 65 outputs the second PWM signal and stops outputting the second PWM signal in accordance with instructions from the controller 70. The controller 70 sets the duty cycle of the second PWM signal in the signal output unit 65. While outputting the second PWM signal, the signal output unit 65 adjusts the duty cycle of the second PWM signal to the set value.

Second Power Supply Control Processing

Figure 7:
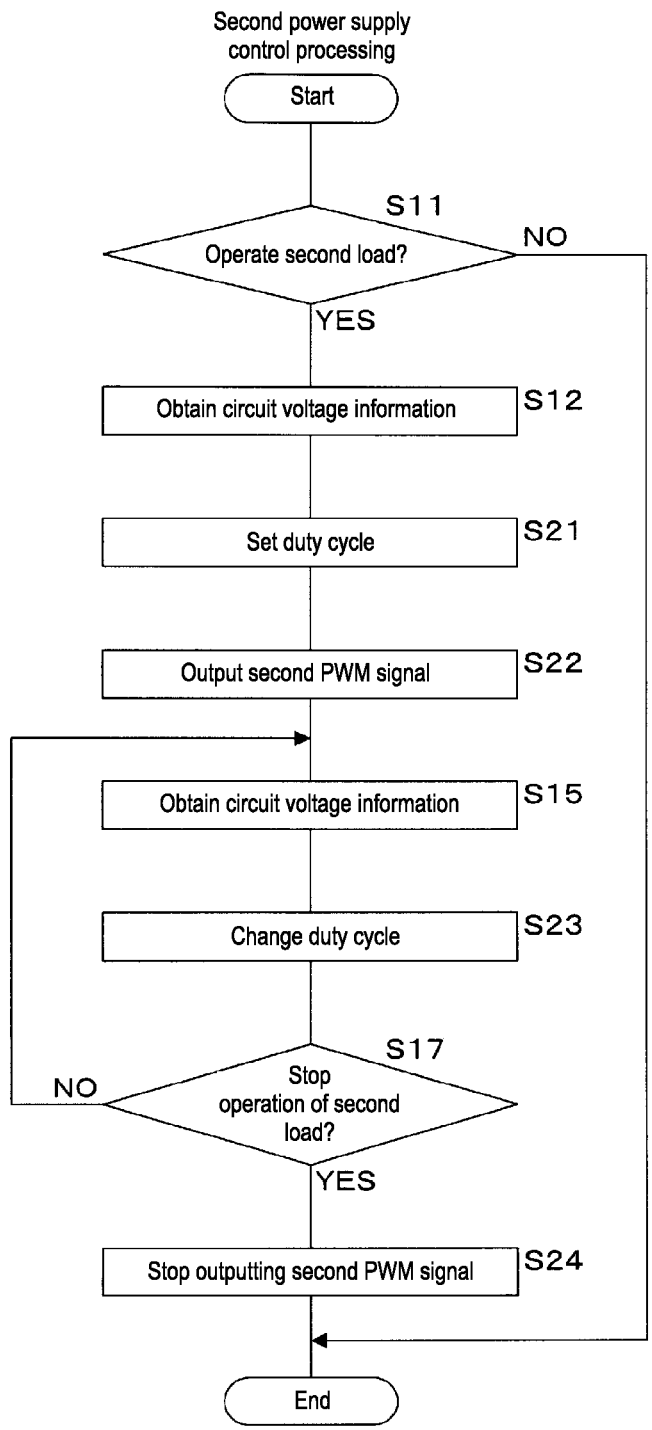
FIG. 7 is a flowchart showing the procedure of second power supply control processing according to a second embodiment.

FIG. 7 is a flowchart showing the procedure of second power supply control processing according to the second embodiment. In the second power supply control processing according to the second embodiment, steps that are the same as those in the second power supply control processing according to the first embodiment are denoted by the same reference signs as those used in the first embodiment, and descriptions of those steps are omitted. The steps common to the first and second embodiments are steps S11, S12, S15, and S17.

Similarly to the first embodiment, the second power supply control processing according to the second embodiment is executed while the second FET 40 is OFF. In the second power supply control processing, the controller 70 first executes step S11. If it is determined not to cause the second load 12 to operate (S11: NO), the controller 70 ends the second power supply control processing and again starts the second power supply control processing. Accordingly, when determining not to cause the second load 12 to operate in step S11, the controller 70 again executes step S11.

If it is determined to cause the second load 12 to operate (S11: YES), the controller 70 executes step S12. After obtaining circuit voltage information from the A/D converter 62 in step S12, the controller 70 sets the duty cycle of the second PWM signal in the signal output unit 65 in accordance with a circuit voltage indicated by the obtained circuit voltage information (step S21). The circuit voltage indicated by the circuit voltage information obtained in step S12 is a circuit voltage of the case where the second FET 40 is OFF.

Next, the controller 70 instructs the signal output unit 65 to output the second PWM signal to the second drive circuit 42 (step S22). As a result, the second drive circuit 42 repeatedly switches the second FET 40 between ON and OFF in accordance with the voltage of the second PWM signal. Consequently, a current flows successively through the first lead wire resistor Rw1, the second FET 40, the second output unit 41, the second load 12, and the ground conductor G, and power is supplied to the second load 12. The average value of voltage applied to the second load 12 is adjusted in accordance with the duty cycle of the second PWM signal.

After executing step S22, the controller 70 executes step S15. In step S15, the controller 70 obtains circuit voltage information while the second FET 40 is ON, namely the second PWM signal has the high-level voltage. After obtaining the circuit voltage information in step S15, the controller 70 changes the duty cycle of the second PWM signal in accordance with a circuit voltage indicated by the obtained circuit voltage information (step S23). Thus, the duty cycle of the second PWM signal is changed. After executing step S23, the controller 70 executes step S17.

If it is determined not to stop operation of the second load 12 (S17: NO), the controller 70 executes step S15. The controller 70 repeatedly changes the duty cycle in accordance with the circuit voltage until the controller 70 determines to stop operation of the second load 12. If it is determined to stop operation of the second load 12 (S17: YES), the controller 70 instructs the signal output unit 65 to stop outputting the second PWM signal (step S24), and ends the second power supply control processing. After ending the second power supply control processing, the controller 70 again executes the second power supply control processing. The controller 70 stops repeating the second power supply control processing when the engine is stopped, for example.

As described above, in the second power supply control processing, the controller 70 changes the duty cycle of the second PWM signal in accordance with a circuit voltage indicated by circuit voltage information output from the second detection circuit 25. The second drive circuit 42 switches the second FET 40 ON or OFF in accordance with the voltage of the second PWM signal. Therefore, the average value of voltage applied to the second load 12 is adjusted to an appropriate value, and power supply to the second load 12 is appropriately controlled. The second load 12 in the second embodiment is a lamp, for example.

The effects obtained with use of the power supply control device 13 and the second detection circuit 25 according to the first embodiment are respectively obtained with use of the power supply control device 13 and the second detection circuit 25 according to the second embodiment.

Supplementary Note

In the second embodiment, the signal output unit 64 may also be configured similarly to the signal output unit 65. In this case, the signal output unit 64 outputs a first PWM signal similar to the second PWM signal, and the first drive circuit 32 switches the first FET 30 ON or OFF in accordance with a voltage of the first PWM signal. The controller 70 executes first power supply control processing similarly to the second power supply control processing.

The second FET 40, the second drive circuit 42, and the circuit voltage information referred to in the description of the second power supply control processing respectively correspond to the first FET 30, the first drive circuit 32, and the power source voltage information in the first power supply control processing. The A/D converters 62 and 63 and the signal output unit 65 referred to in the description of the second power supply control processing respectively correspond to the A/D converters 60 and 61 and the signal output unit 64 in the first power supply control processing.

Third Embodiment

In the first embodiment, a current always flows through the second detection circuit 25 and the second detection circuit 25 always detects the circuit voltage. However, a configuration is also possible in which the second detection circuit 25 does not always detect the circuit voltage.

The following describes differences of a third embodiment from the first embodiment. Configurations other than those described below are the same as those in the first embodiment. Therefore, structural features that are the same as those in the first embodiment are denoted by the same reference signs as those used in the first embodiment, and descriptions of those structural features are omitted.

Configuration of Second Detection Circuit 25

Figure 8:
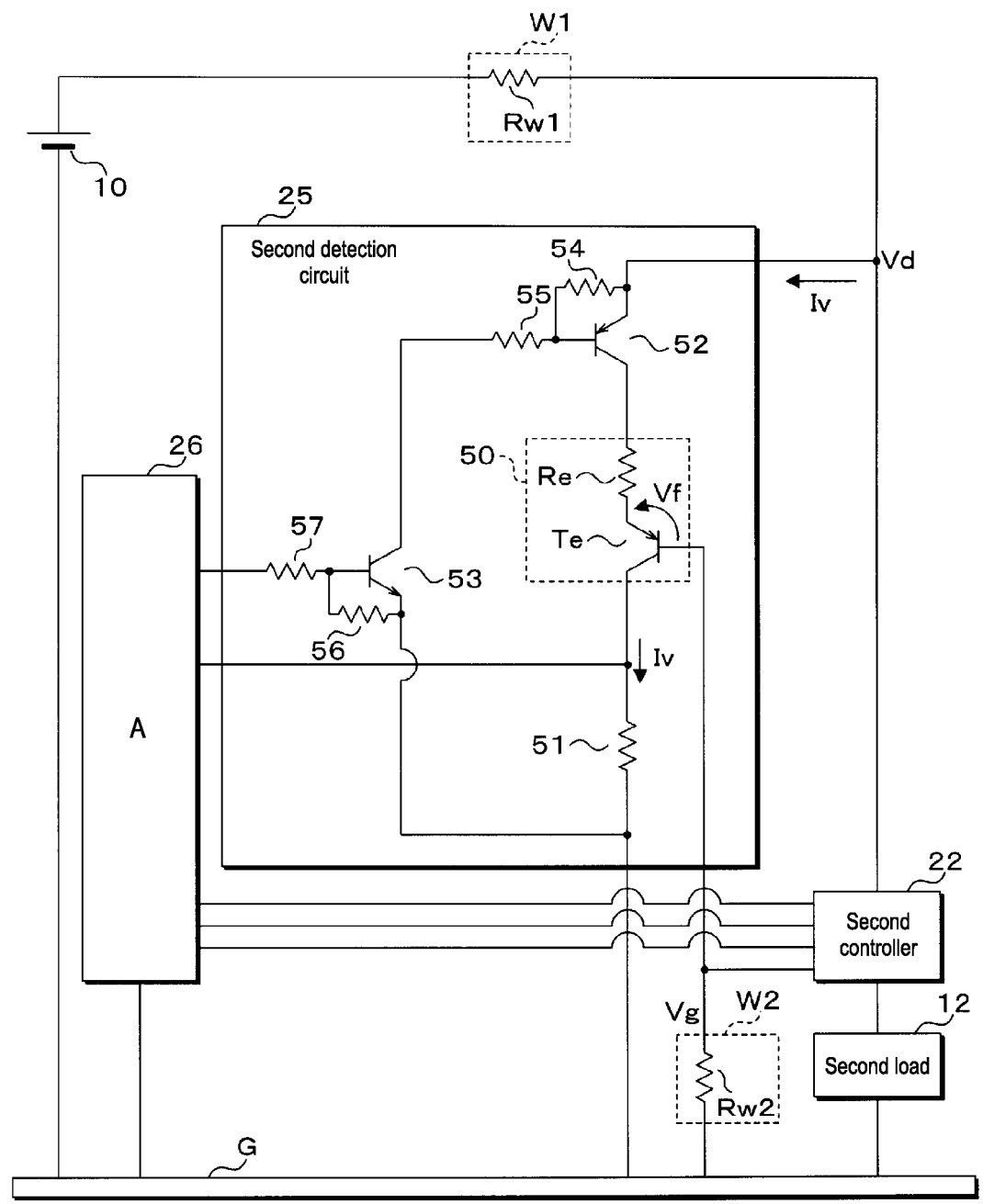
FIG. 8 is a circuit diagram of a second detection circuit according to a third embodiment.

FIG. 8 is a circuit diagram of a second detection circuit 25 according to the third embodiment. Similarly to the first embodiment, the second detection circuit 25 according to the third embodiment includes a current output device 50 and a circuit resistor 51. The current output device 50 and the circuit resistor 51 are connected in the same manner as in the first embodiment, except for the upstream end of the device resistor Re.

The second detection circuit 25 according to the third embodiment further includes a first circuit switch 52, a second circuit switch 53, and switch resistors 54, 55, 56, and 57. The first circuit switch 52 is a PNP bipolar transistor. The second circuit switch 53 is an NPN bipolar transistor.

The emitter of the first circuit switch 52 is connected to the drain of the second FET 40. The collector of the first circuit switch 52 is connected to the upstream end of the device resistor Re. The switch resistor 54 is connected between the emitter and the base of the first circuit switch 52. An end of the switch resistor 55 is connected to the base of the first circuit switch 52. The first circuit switch 52 functions as a connection switch.

The other end of the switch resistor 55 is connected to the collector of the second circuit switch 53. The emitter of the second circuit switch 53 is connected to the ground conductor G. The switch resistor 56 is connected between the emitter and the base of the second circuit switch 53. The base of the second circuit switch 53 is connected to the microcomputer 26 via the switch resistor 57.

The microcomputer 26 adjusts the voltage of the base of the second circuit switch 53 relative to the potential of the ground conductor G to a high-level voltage or a low-level voltage. The second circuit switch 53 is switched ON when the voltage of the base of the second circuit switch 53 is adjusted to the high-level voltage by the microcomputer 26. When the second circuit switch 53 is ON, a resistance value between the collector and the emitter of the second circuit switch 53 is sufficiently small, and a current can flow via the collector and the emitter.

When the second circuit switch 53 is ON, a current flows from the upstream end of the second controller 22 successively through the switch resistors 54 and 55, the second circuit switch 53, and the ground conductor G. As a result, the first circuit switch 52 is switched ON. When the first circuit switch 52 is ON, a resistance value between the emitter and the collector of the first circuit switch 52 is sufficiently small, and a current can flow via the emitter and the collector. When the first circuit switch 52 is ON, the current output device 50 draws a current from the drain of the second FET 40 via the first circuit switch 52, and the second detection circuit 25 detects the circuit voltage. As described above, the second detection circuit 25 operates when the first circuit switch 52 is ON.

The second circuit switch 53 is switched OFF when the voltage of the base of the second circuit switch 53 is adjusted to the low-level voltage by the microcomputer 26. When the second circuit switch 53 is OFF, the resistance value between the collector and the emitter of the second circuit switch 53 is sufficiently large, and no current flows through the collector and the emitter.

When the second circuit switch 53 is switched OFF, the flow of a current via the switch resistor 54 stops, and accordingly, the first circuit switch 52 is switched OFF. When the first circuit switch 52 is OFF, the resistance value between the emitter and the collector of the first circuit switch 52 is sufficiently large, and no current flows through the emitter and the collector. When the first circuit switch 52 is switched OFF, the current output device 50 stops drawing a current via the first circuit switch 52, and the second detection circuit 25 stops operation.

As described above, the microcomputer 26 switches the first circuit switch 52 ON or OFF by adjusting the voltage of the base of the second circuit switch 53 to the high-level voltage or the low-level voltage.

Configuration of First Detection Circuit 24

Similarly to the second detection circuit 25, a first detection circuit 24 according to the third embodiment includes a first circuit switch 52, a second circuit switch 53, and switch resistors 54, 55, 56, and 57 in addition to the voltage-dividing resistors Rd1 and Rd2. The first circuit switch 52, the second circuit switch 53, and the switch resistors 54, 55, 56, and 57 are connected in the same manner as in the second detection circuit 25. Accordingly, the first circuit switch 52 is connected between the first controller 21 and the upstream end of the voltage-dividing resistor Rd1. The emitter of the second circuit switch 53 is connected to the downstream end of the voltage-dividing resistor Rd2. The base of the second circuit switch 53 is connected to the microcomputer 26 via the switch resistor 57.

The microcomputer 26 switches the first circuit switch 52 ON or OFF by adjusting the voltage of the base of the second circuit switch 53 relative to the potential of the ground conductor G to the high-level voltage or the low-level voltage. When the voltage of the base of the second circuit switch 53 is switched to the high-level voltage, the first circuit switch 52 is switched ON, and the first detection circuit 24 operates. When the voltage of the base of the second circuit switch 53 is switched to the low-level voltage, the first circuit switch 52 is switched OFF, and the first detection circuit 24 stops operation.

Configuration of Microcomputer 26

Figure 9:
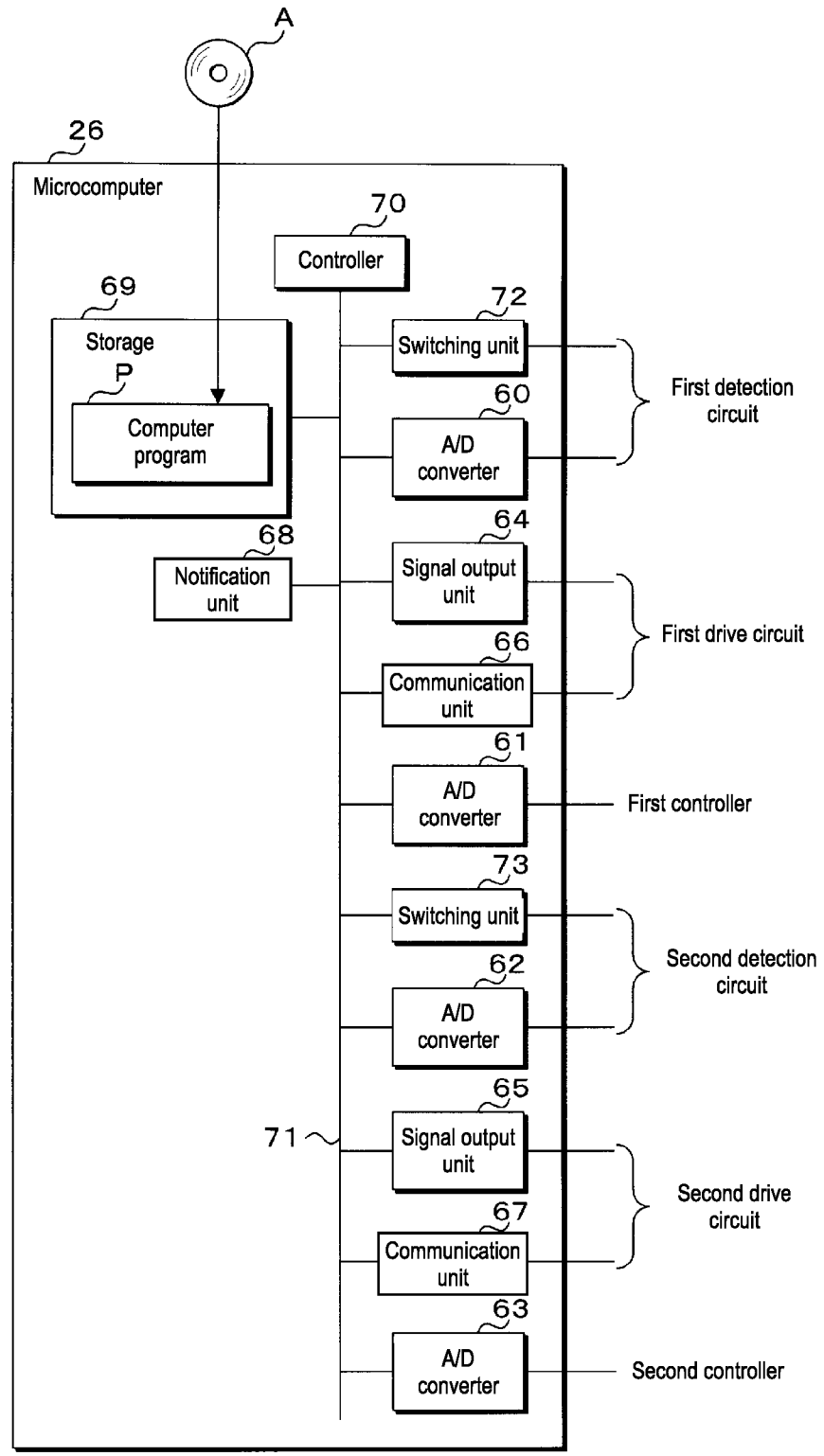
FIG. 9 is a block diagram showing the configuration of the main part of a microcomputer.

FIG. 9 is a block diagram showing the configuration of the main part of a microcomputer 26. The microcomputer 26 according to the third embodiment includes switching units 72 and 73 in addition to the constitutional units included in the microcomputer 26 according to the first embodiment. The switching units 72 and 73 are connected to the internal bus 71. The switching unit 72 is further connected to the second circuit switch 53 via the switch resistor 57 in the first detection circuit 24. The switching unit 73 is further connected to the second circuit switch 53 via the switch resistor 57 in the second detection circuit 25.

The switching unit 72 adjusts the voltage of the base of the second circuit switch 53 included in the first detection circuit 24 relative to the potential of the ground conductor G to the high-level voltage or the low-level voltage. The switching unit 72 switches the first circuit switch 52 ON or OFF in accordance with instructions from the controller 70. Specifically, the switching unit 72 switches the second circuit switch 53 ON by adjusting the voltage at the base of the second circuit switch 53 to the high-level voltage. As a result, the first circuit switch 52 is switched ON. The switching unit 72 switches the second circuit switch 53 OFF by adjusting the voltage at the base of the second circuit switch 53 to the low-level voltage. As a result, the first circuit switch 52 is switched OFF.

Likewise, the switching unit 73 adjusts the voltage at the base of the second circuit switch 53 included in the second detection circuit 25 relative to the potential of the ground conductor G to the high-level voltage or the low-level voltage. The switching unit 73 switches the first circuit switch 52 ON or OFF in accordance with instructions from the controller 70. Specifically, the switching unit 73 switches the second circuit switch 53 ON by adjusting the voltage at the base of the second circuit switch 53 to the high-level voltage. As a result, the first circuit switch 52 is switched ON. The switching unit 73 switches the second circuit switch 53 OFF by adjusting the voltage at the base of the second circuit switch 53 to the low-level voltage. As a result, the first circuit switch 52 is switched OFF.

Second Fault Detection Processing

Figure 10:
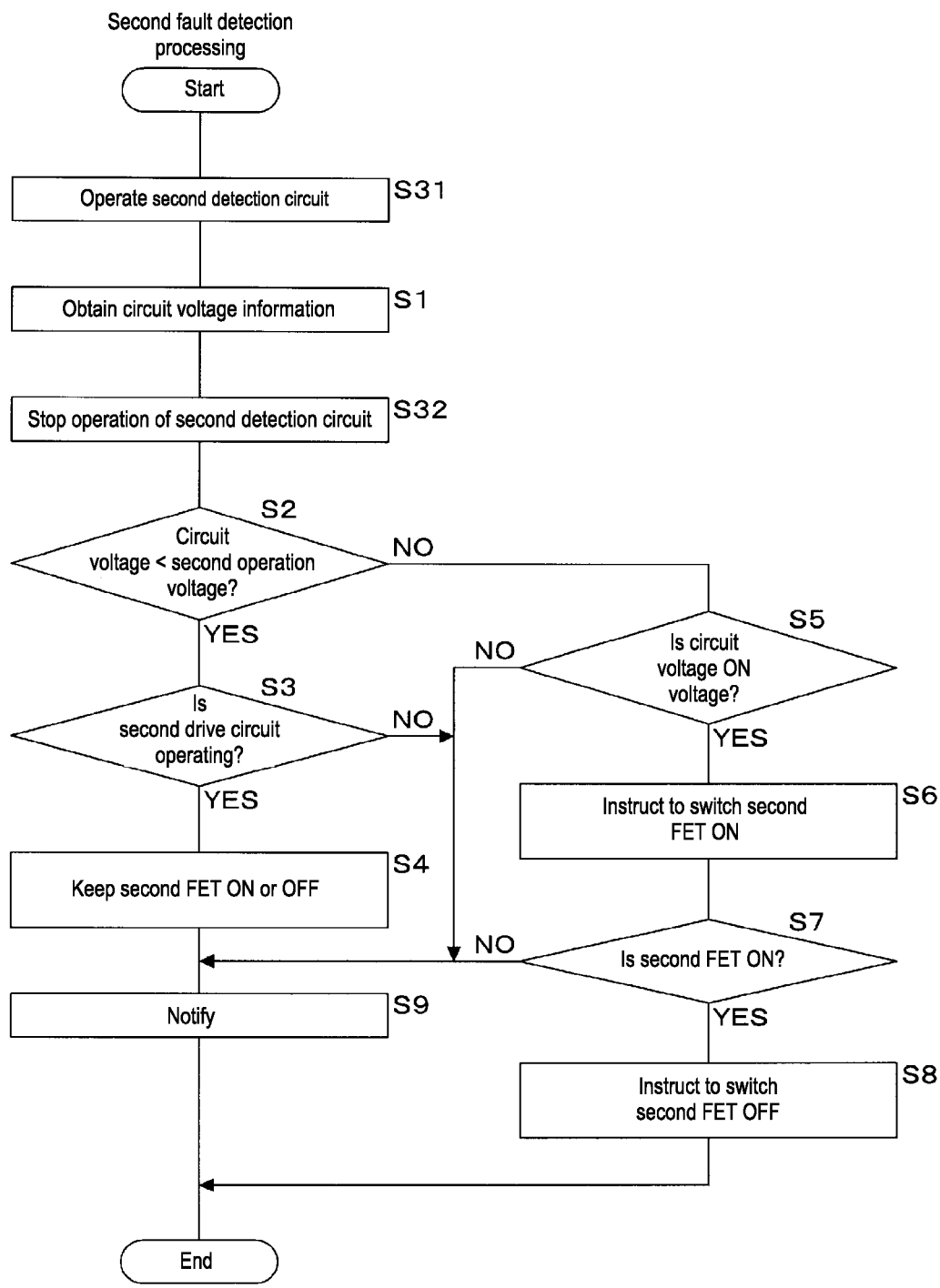
FIG. 10 is a flowchart showing the procedure of second fault detection processing.

FIG. 10 is a flowchart showing the procedure of second fault detection processing. Similarly to the first embodiment, the controller 70 executes the second fault detection processing before causing the second load 12 to operate. Accordingly, the second fault detection processing is executed while the second FET 40 is OFF. If no fault is detected in the second fault detection processing, the controller 70 executes second power supply control processing.

All the steps executed in the second fault detection processing according to the first embodiment are executed in the second fault detection processing according to the third embodiment. These steps are denoted by the same reference signs as those used in the first embodiment, and descriptions thereof are omitted. The steps executed in the second fault detection processing according to the first embodiment are steps S1 to S9.

In the second fault detection processing, the controller 70 first causes the second detection circuit 25 to operate by instructing the switching unit 72 to switch ON the first circuit switch 52 included in the second detection circuit 25 (step S31).

After executing step S31, the controller 70 executes step S1 to obtain circuit voltage information from the A/D converter 62.

After executing step S1, the controller 70 stops operation of the second detection circuit 25 by instructing the switching unit 72 to switch OFF the first circuit switch 52 included in the second detection circuit 25 (step S32). After executing step S32, the controller 70 executes step S2.

Second Power Supply Control Processing

Figure 11:
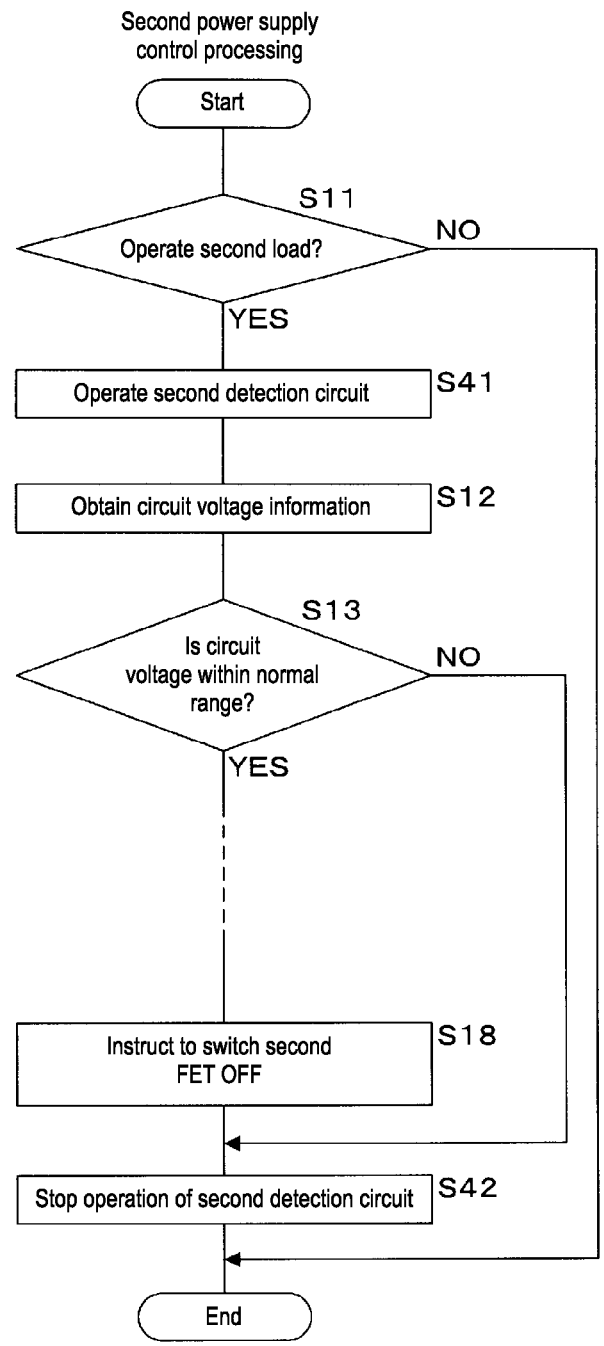
FIG. 11 is a flowchart showing the procedure of second power supply
control processing.

FIG. 11 is a flowchart showing the procedure of the second power supply control processing. Similarly to the first embodiment, the second power supply control processing is executed while the second FET 40 is OFF.

All the steps executed in the second power supply control processing according to the first embodiment are executed in the second power supply control processing according to the third embodiment. These steps are denoted by the same reference signs as those used in the first embodiment, and descriptions thereof are omitted. The steps executed in the second power supply control processing according to the first embodiment are steps S11 to S18.

In the second power supply control processing, if it is determined to cause the second load 12 to operate (S11: YES), the controller 70 causes the second detection circuit 25 to operate by instructing the switching unit 72 to switch ON the first circuit switch 52 included in the second detection circuit 25 (step S41). After executing step S41, the controller 70 executes step S12.

After executing step S18 or if it is determined that the circuit voltage indicated by circuit voltage information obtained in step S12 does not fall within the normal range (S13: NO), the controller 70 stops operation of the second detection circuit 25 by instructing the switching unit 72 to switch OFF the first circuit switch 52 included in the second detection circuit 25 (step S42). After executing step S42, the controller 70 ends the second power supply control processing.

First Fault Detection Processing and First Power Supply Control Processing

The controller 70 executes first fault detection processing similarly to the second fault detection processing. The controller 70 executes first power supply control processing similarly to the second power supply control processing. When it is necessary to obtain power source voltage information, the controller 70 instructs the switching unit 72 to switch ON the first circuit switch 52 included in the first detection circuit 24. As a result, the first detection circuit 24 operates. When it is no longer necessary to obtain power source voltage information, the controller 70 instructs the switching unit 72 to switch OFF the first circuit switch 52 included in the first detection circuit 24. As a result, the first detection circuit 24 stops operation.

As described above, in the power supply control device 13 according to the third embodiment, the first detection circuit 24 is caused to operate only when it is necessary to detect the power source voltage. The second detection circuit 25 is caused to operate only when it is necessary to detect the circuit voltage. Therefore, unnecessary power consumption is suppressed.

The effects obtained with use of the power supply control device 13 according to the first embodiment are obtained with use of the power supply control device 13 according to the third embodiment.

Fourth Embodiment

The microcomputer 26, the first detection circuit 24, and the second detection circuit 25 in the second embodiment may also be configured in the same manner as in the third embodiment.

The following describes differences of a fourth embodiment from the second embodiment. Configurations other than those described below are the same as those in the second embodiment. Therefore, structural features that are the same as those in the second embodiment are denoted by the same reference signs as those used in the second embodiment, and descriptions of those structural features are omitted.

First Fault Detection Processing and Second Fault Detection Processing

In a power supply control device 13 according to the fourth embodiment, the microcomputer 26, the first detection circuit 24, and the second detection circuit 25 are configured in the same manner as in the third embodiment. The controller 70 included in the microcomputer 26 executes first fault detection processing and second fault detection processing in the same manner as in the third embodiment.

Second Power Supply Control Processing

Figure 12:
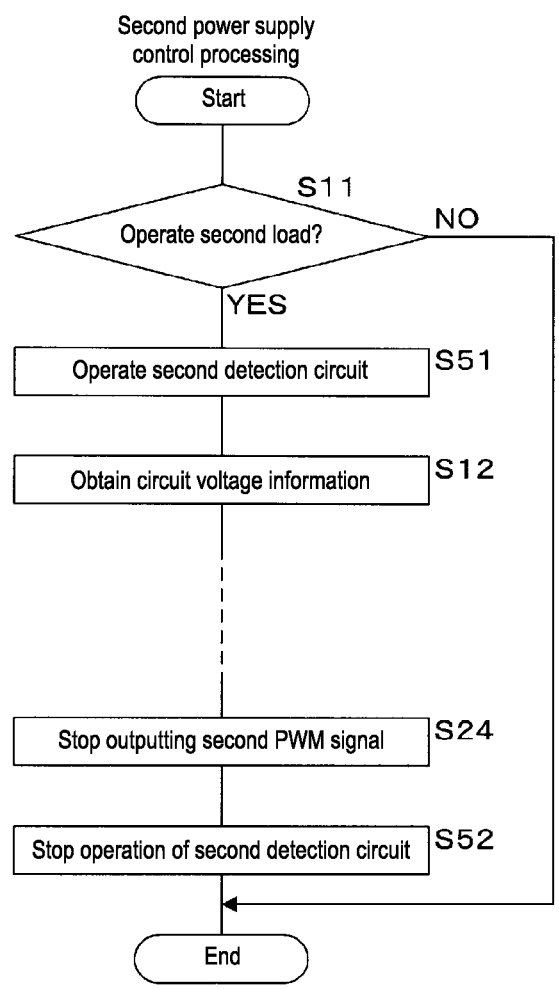
FIG. 12 is a flowchart showing the procedure of second power supply control processing according to a fourth embodiment.

FIG. 12 is a flowchart showing the procedure of second power supply control processing according to the fourth embodiment. Similarly to the second embodiment, the second power supply control processing is executed while the second FET 40 is OFF.

All the steps executed in the second power supply control processing according to the second embodiment are executed in the second power supply control processing according to the fourth embodiment. These steps are denoted by the same reference signs as those used in the second embodiment, and descriptions thereof are omitted. The steps executed in the second power supply control processing according to the second embodiment are steps S11, S12, S15, S17, and S21 to S24.

In the second power supply control processing, if it is determined to cause the second load 12 to operate (S11: YES), the controller 70 causes the second detection circuit 25 to operate by instructing the switching unit 72 to switch ON the first circuit switch 52 included in the second detection circuit 25 (step S51). After executing step S51, the controller 70 executes step S12.

After executing step S24, the controller 70 stops operation of the second detection circuit 25 by instructing the switching unit 72 to switch OFF the first circuit switch 52 included in the second detection circuit 25 (step S52). After executing step S52, the controller 70 ends the second power supply control processing.

First Power Supply Control Processing

The controller 70 executes first power supply control processing similarly to the second power supply control processing. The controller 70 causes the first detection circuit 24 to operate when it is necessary to obtain power source voltage information. The controller 70 stops operation of the first detection circuit 24 when it is no longer necessary to obtain power source voltage information.

As described above, in the power supply control device 13 according to the fourth embodiment, the first detection circuit 24 is caused to operate only when it is necessary to detect the power source voltage. The second detection circuit 25 is caused to operate only when it is necessary to detect the circuit voltage. Therefore, unnecessary power consumption is suppressed.

The effects obtained with use of the power supply control device 13 according to the second embodiment are obtained with use of the power supply control device 13 according to the fourth embodiment.

Supplementary Note

In the third and fourth embodiments, the first circuit switch 52 is not limited to the PNP bipolar transistor, and may also be a P-channel FET. The second circuit switch 53 is not limited to the NPN bipolar transistor, and may also be an N-channel FET. Also, the first circuit switch 52 is not limited to the semiconductor switch, and may also be a relay contact. The circuit for switching the first circuit switch 52 ON or OFF is not limited to the circuit in which the second circuit switch 53 is used.

Fifth Embodiment

The number of DC power sources included in the power supply system 1 according to the first embodiment is one. However, the number of DC power sources included in the power supply system 1 is not limited to one.

The following describes differences of a fifth embodiment from the first embodiment. Configurations other than those described below are the same as those in the first embodiment. Therefore, structural features that are the same as those in the first embodiment are denoted by the same reference signs as those used in the first embodiment, and descriptions of those structural features are omitted.

Configuration of Power Supply System 1

Figure 13:
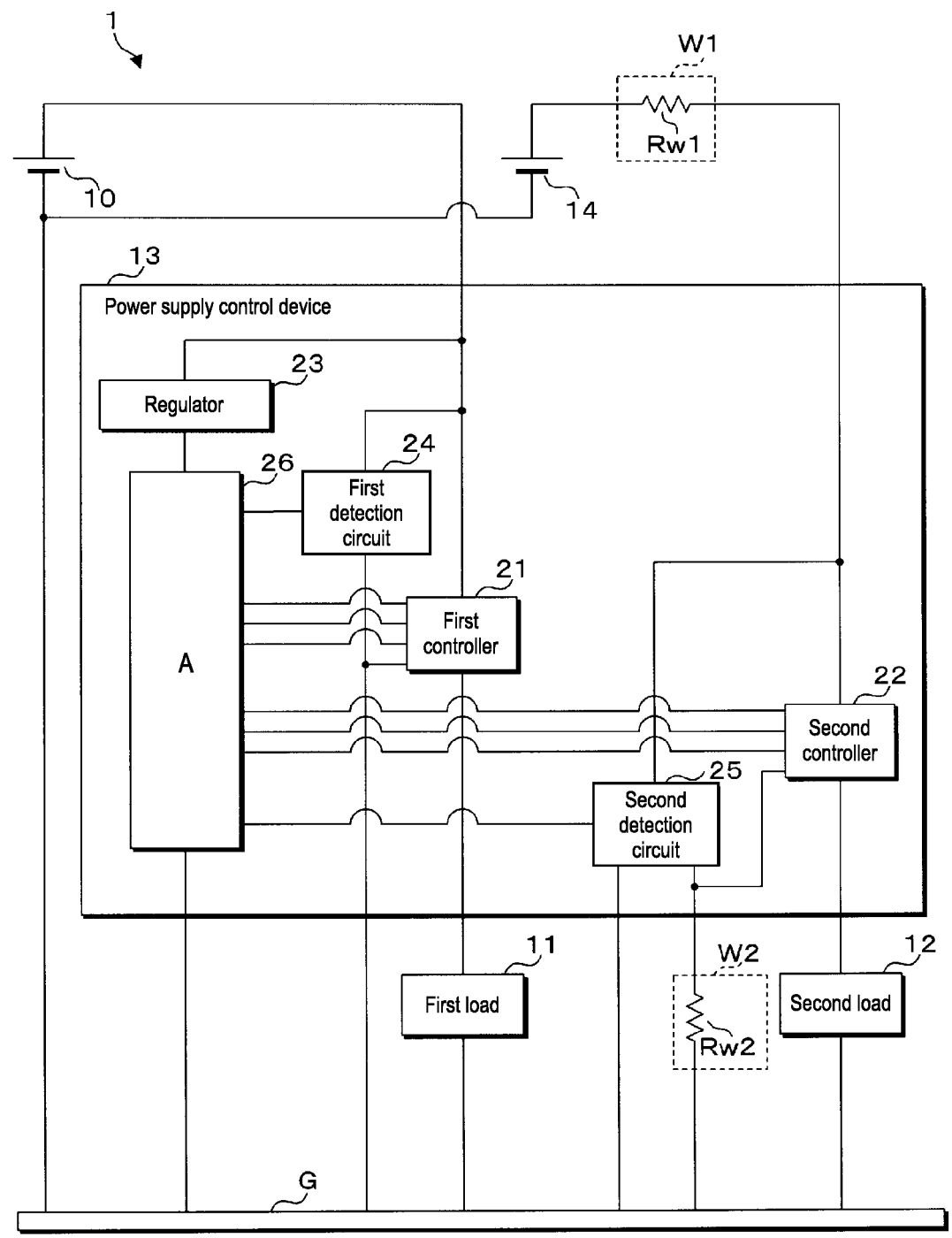
FIG. 13 is a block diagram showing the configuration of the main part of a power supply system according to a fifth embodiment.

FIG. 13 is a block diagram showing the configuration of the main part of a power supply system 1 according to the fifth embodiment. The power supply system 1 according to the fifth embodiment includes a second DC power source 14 in addition to the structural features included in the power supply system 1 according to the first embodiment. The second DC power source 14 is a battery, for example. The negative electrode of the second DC power source 14 is connected to the ground conductor G. The positive electrode of the second DC power source 14 is connected to an end of the first lead wire resistor Rw1. The other end of the first lead wire resistor Rw1 is connected in the same manner as in the first embodiment. In the fifth embodiment, not the DC power source 10 but the second DC power source 14 functions as a power source of the second load 12, the second controller 22, and the second detection circuit 25.

The effects obtained with use of the power supply control device 13, the first detection circuit 24, and the second detection circuit 25 according to the first embodiment are respectively obtained with use of the power supply control device 13, the first detection circuit 24, and the second detection circuit 25 according to the fifth embodiment.

Sixth Embodiment

The downstream end of the second load 12 is connected to the ground conductor G in the first embodiment. However, there is no limitation to the configuration in which the downstream end of the second load 12 is connected to the ground conductor G. The following describes differences of a sixth embodiment from the first embodiment. Configurations other than those described below are the same as those in the first embodiment. Therefore, structural features that are the same as those in the first embodiment are denoted by the same reference signs as those used in the first embodiment, and descriptions of those structural features are omitted.

Configuration of Power Supply System 1

Figure 14:
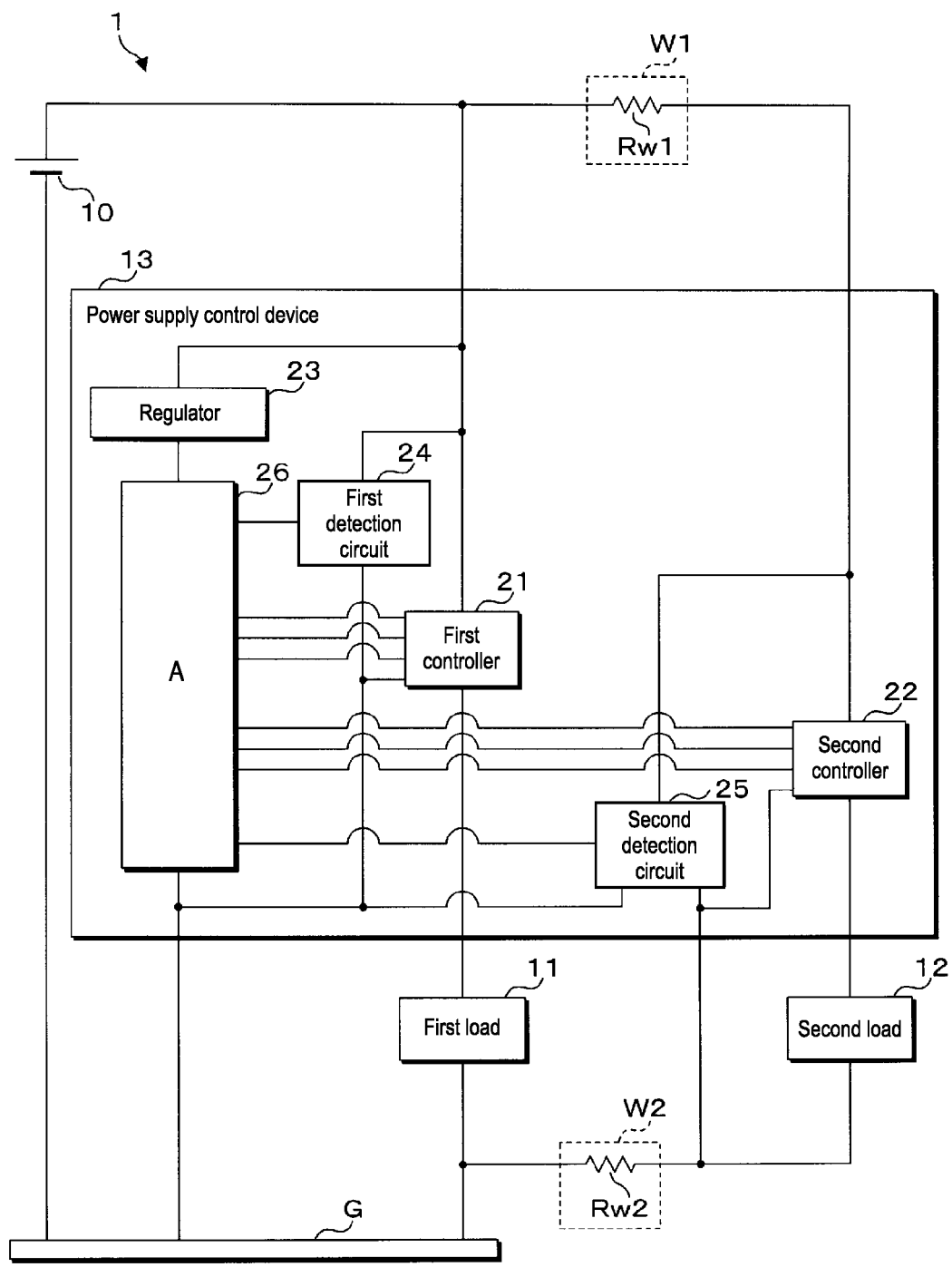
FIG. 14 is a block diagram showing the configuration of the main part of a power supply system according to a sixth embodiment.

FIG. 14 is a block diagram showing the configuration of the main part of a power supply system 1 according to the sixth embodiment. In the power supply system 1 according to the sixth embodiment, the downstream end of the second load 12 is connected to the upstream end of the second lead wire resistor Rw2. In the power supply system 1 according to the sixth embodiment, when the second FET 40 included in the second controller 22 is ON, a current flows from the positive electrode of the DC power source 10 successively through the first lead wire resistor Rw1, the second FET 40, the second output unit 41, the second load 12, the second lead wire resistor Rw2, and the ground conductor G. In this case, the circuit voltage matches the voltage at the drain of the second FET 40 relative to the potential of the downstream end of the second load 12.

The effects obtained with use of the power supply control device 13, the first detection circuit 24, and the second detection circuit 25 according to the first embodiment are respectively obtained with use of the power supply control device 13, the first detection circuit 24, and the second detection circuit 25 according to the sixth embodiment.

Supplementary Note

In the second to fourth and sixth embodiments, the power supply system 1 may also include the DC power source 10 and the second DC power source 14 similarly to the fifth embodiment.

In the second to fifth embodiments, the downstream end of the second load 12 may also be connected to the upstream end of the second lead wire resistor Rw2 similarly to the sixth embodiment.

As long as the second lead wire W2 is used in the first to sixth embodiments, it is necessary to detect the circuit voltage, and the second detection circuit 25 functions effectively. Therefore, the first lead wire W1 may also be a lead wire whose resistance value is negligible.

In the first to sixth embodiments, the downstream end of the second voltage resistor 43 included in the second controller 22 does not necessarily have to be connected to the upstream end of the second lead wire resistor Rw2, and may also be connected to the ground conductor G. In this case, a current output from the second output unit 41 does not flow through the second lead wire resistor Rw2, and accordingly, the voltage between the two ends of the second lead wire resistor Rw2 does not fluctuate in accordance with a current output from the second output unit 41.

In the first to sixth embodiments, the member connected between the positive electrode of the DC power source 10 and the drain of the second FET 40 is only required to be a resistive member that has a resistance component. Accordingly, the first lead wire W1 may also be replaced with a circuit element whose resistance value is not negligible. An example of such a circuit element is a semiconductor switch whose ON resistance value is not negligible. Likewise, the member connected between the second drive circuit 42 and the ground conductor G in the first to sixth embodiments is only required to be a resistive member that has a resistance component. Accordingly, the second lead wire W2 may also be replaced with a circuit element whose resistance value is not negligible.

In the first to sixth embodiments, the switches used to control power supply to the first load 11 and the second load 12 are only required to be semiconductor switches configured in such a manner that the higher a voltage applied to the control terminal is, the smaller a resistance value between the current input terminal and the current output terminal becomes. Accordingly, an IGBT (Insulated Gate Bipolar Transistor) may also be used instead of the first FET 30. Likewise, an IGBT may also be used instead of the second FET 40.

The first to sixth embodiments disclosed above are examples in all aspects and should not be construed to be limiting the present disclosure. The scope of the present disclosure is defined not by the above description but by the claims, and is intended to encompass all modifications within the meanings and scope that are equivalent to the claims.

The invention claimed is:

1. A detection circuit comprising:
a current output device configured to output a current corresponding to a circuit voltage between an input terminal of a semiconductor switch to which a current is input and ground of a switching circuit that switches the semiconductor switch ON or OFF; and
a circuit resistor through which the current that is output from the current output device flows,
wherein a voltage between two ends of the circuit resistor is output, and
a voltage between the ground of the switching circuit and a downstream end of the circuit resistor is higher than 0 V; and
wherein the current output device includes:
a device resistor to which a current flows from the input terminal of the semiconductor switch; and
a PNP bipolar transistor including an emitter connected to a downstream end of the device resistor,
wherein a potential of a base of the bipolar transistor is a ground potential of the switching circuit, and
a current output from a collector of the bipolar transistor flows to the circuit resistor.

2. The detection circuit according to claim 1, further comprising
a connection switch connected between the input terminal of the semiconductor switch and the current output device,
wherein the current output device outputs a current drawn from the input terminal of the semiconductor switch to the circuit resistor.

3. A power supply control device configured to control power that is supplied via a semiconductor switch, the power supply control device comprising:
a switching circuit configured to switch the semiconductor switch ON or OFF;
the detection circuit as set forth in claim 1; and
a processor configured to execute processing,
wherein the processor instructs the switching circuit to switch the semiconductor switch ON or OFF in accordance with a voltage that is output from the detection circuit,
the detection circuit includes:
a current output device configured to output a current corresponding to the circuit voltage; and
a circuit resistor through which the current that is output from the current output device flows,
the detection circuit outputs a voltage between two ends of the circuit resistor, and
a voltage between the ground of the switching circuit and a downstream end of the circuit resistor is higher than 0 V.

4. The power supply control device according to claim 3, further comprising
a current output unit configured to output a current corresponding to a current flowing through the semiconductor switch, and
the voltage between the ground of the switching circuit and the downstream end of the circuit resistor fluctuates in accordance with the current that is output from the current output unit.

5. The power supply control device according to claim 4, wherein the switching circuit steps up the circuit voltage, and applies the stepped-up voltage to a control terminal of the semiconductor switch to switch the semiconductor switch ON.

6. The power supply control device according to claim 4, wherein power is supplied to the switching circuit with a current that flows from the input terminal of the semiconductor switch successively through the switching circuit and the ground of the switching circuit,
the processor determines whether or not the circuit voltage is lower than a threshold voltage based on a voltage that is output from the detection circuit while the semiconductor switch is OFF, and
if it is determined that the circuit voltage is lower than the threshold voltage, the processor determines whether or not the switching circuit is operating.

7. The power supply control device according to claim 3, wherein the switching circuit steps up the circuit voltage, and applies the stepped-up voltage to a control terminal of the semiconductor switch to switch the semiconductor switch ON.

8. The power supply control device according to claim 7, wherein the processor determines whether or not the circuit voltage is an ON voltage based on a voltage that is output from the detection circuit while the semiconductor switch is OFF, the ON voltage being a voltage that can be stepped up to a voltage with which the semiconductor switch can be switched ON,
if it is determined that the circuit voltage is the ON voltage, the processor instructs the switching circuit to switch the semiconductor switch ON, and
after giving the instruction to switch the semiconductor switch ON, the processor determines whether or not the semiconductor switch is ON.

9. The power supply control device according to claim 8, wherein power is supplied to the switching circuit with a current that flows from the input terminal of the semiconductor switch successively through the switching circuit and the ground of the switching circuit,
the processor determines whether or not the circuit voltage is lower than a threshold voltage based on a voltage that is output from the detection circuit while the semiconductor switch is OFF, and
if it is determined that the circuit voltage is lower than the threshold voltage, the processor determines whether or not the switching circuit is operating.

10. The power supply control device according to claim 7, wherein power is supplied to the switching circuit with a current that flows from the input terminal of the semiconductor switch successively through the switching circuit and the ground of the switching circuit,
the processor determines whether or not the circuit voltage is lower than a threshold voltage based on a voltage that is output from the detection circuit while the semiconductor switch is OFF, and if it is determined that the circuit voltage is lower than the threshold voltage, the processor determines whether or not the switching circuit is operating.

11. The power supply control device according to claim 3, wherein power is supplied to the switching circuit with a current that flows from the input terminal of the semiconductor switch successively through the switching circuit and the ground of the switching circuit, the processor determines whether or not the circuit voltage is lower than a threshold voltage based on a voltage that is output from the detection circuit while the semiconductor switch is OFF, and if it is determined that the circuit voltage is lower than the threshold voltage, the processor determines whether or not the switching circuit is operating.

12. A detection circuit comprising:

a current output device configured to output a current corresponding to a circuit voltage between an input terminal of a semiconductor switch to which a current is input and ground of a switching circuit that switches the semiconductor switch ON or OFF, wherein the current output device includes a device resistor to which a current flows from the input terminal of the semiconductor switch; and a PNP bipolar transistor including an emitter connected to a downstream end of the device resistor;

a circuit resistor through which the current that is output from the current output device flows; and a connection switch connected between the input terminal of the semiconductor switch and the current output device, wherein the current output device outputs a current drawn from the input terminal of the semiconductor switch to the circuit resistor; and wherein a voltage between two ends of the circuit resistor is output, and a voltage between the ground of the switching circuit and a downstream end of the circuit resistor is higher than 0 V; and a potential of a base of the bipolar transistor is a ground potential of the switching circuit, and a current output from a collector of the bipolar transistor flows to the circuit resistor.

\* \* \* \* \*